United States Patent
Feng et al.

(10) Patent No.: US 11,823,629 B2
(45) Date of Patent: Nov. 21, 2023

(54) SHIFT REGISTER UNIT AND DRIVING METHOD THEREFOR, GATE DRIVING CIRCUIT AND DISPLAY DEVICE

(71) Applicants: Hefei BOE Joint Technology Co., Ltd., Anhui (CN); BOE TECHNOLOGY GROUP CO., LTD., Beijing (CN)

(72) Inventors: Xuehuan Feng, Beijing (CN); Yongqian Li, Beijing (CN)

(73) Assignees: Heifei Boe Joint Technology Co., LTD., Anhui (CN); Boe Technology Group Co., LTD., Beijing (CN)

( * ) Notice: Subject to any disclaimer, the term of this patent is extended or adjusted under 35 U.S.C. 154(b) by 0 days.

(21) Appl. No.: 17/793,075

(22) PCT Filed: Apr. 2, 2021

(86) PCT No.: PCT/CN2021/085208
§ 371 (c)(1),
(2) Date: Jul. 15, 2022

(87) PCT Pub. No.: WO2021/197461
PCT Pub. Date: Oct. 7, 2021

(65) Prior Publication Data
US 2023/0041664 A1    Feb. 9, 2023

(30) Foreign Application Priority Data
Apr. 2, 2020 (CN) .......................... 202010256051.6

(51) Int. Cl.
*G06F 3/038* (2013.01)
*G09G 3/3266* (2016.01)
*G11C 19/28* (2006.01)

(52) U.S. Cl.
CPC .......... *G09G 3/3266* (2013.01); *G11C 19/28* (2013.01); *G09G 2300/0852* (2013.01); *G09G 2310/0286* (2013.01); *G09G 2310/061* (2013.01)

(58) Field of Classification Search
CPC ......... G09G 3/3266; G09G 2300/0852; G09G 2310/0286; G09G 2310/061; G09G 2300/0408; G11C 19/28
(Continued)

(56) References Cited

U.S. PATENT DOCUMENTS 10,547,316 B2    1/2020  Takasugi et al.
11,150,294 B2 *  10/2021 Maiellaro .......... G01R 31/2832
(Continued)

FOREIGN PATENT DOCUMENTS

CN    106548740 A    3/2017
CN    108932930 A    12/2018
(Continued)

OTHER PUBLICATIONS

First Office Action for Application No. 202010256051.6 issued by the Chinese Patent Office dated Nov. 16, 2020.

*Primary Examiner* — Thuy N Pardo
(74) *Attorney, Agent, or Firm* — IP & T GROUP LLP

(57) ABSTRACT

A shift register unit includes a first input/output unit which includes a first pull-down control circuit and a first auxiliary input circuit, and a second input/output unit which includes a second pull-down control circuit and a second auxiliary input circuit. The first pull-down control circuit controls a level of a first pull-down node. The first auxiliary input circuit is coupled to the first pull-down control circuit and controls the first pull-down control circuit together with a level of a first pull-up node in response to a display control signal and a blanking control signal. The second pull-down (Continued)

control circuit controls a level of a second pull-down node. The second auxiliary input circuit is coupled to the second pull-to down control circuit and controls the second pull-down control circuit together with a level of a second pull-up node in response to the display control signal and the blanking control signal.

20 Claims, 11 Drawing Sheets

(58) Field of Classification Search
USPC .......................................... 345/204, 205, 214
See application file for complete search history.

(56) References Cited

U.S. PATENT DOCUMENTS

| | | | | |
|---|---|---|---|---|
| 11,475,824 B2* | 10/2022 | Feng | .................... | G09G 3/3674 |
| 11,568,790 B2* | 1/2023 | Feng | .................... | G09G 3/2092 |
| 2018/0336957 A1 | 11/2018 | Mi et al. | | |
| 2018/0337682 A1 | 11/2018 | Takasugi et al. | | |
| 2019/0340990 A1* | 11/2019 | Koo | .................... | G09G 3/3677 |
| 2020/0168162 A1 | 5/2020 | Feng et al. | | |
| 2021/0158742 A1 | 5/2021 | Feng et al. | | |
| 2021/0201804 A1 | 7/2021 | Feng et al. | | |
| 2021/0201807 A1 | 7/2021 | Feng et al. | | |
| 2021/0210154 A1* | 7/2021 | Feng | .................... | G09G 3/3266 |
| 2021/0335203 A1 | 10/2021 | Feng et al. | | |
| 2021/0375211 A1 | 12/2021 | Feng et al. | | |
| 2022/0005417 A1 | 1/2022 | Feng et al. | | |
| 2022/0284863 A1* | 9/2022 | Yuan | .................... | G11C 19/28 |
| 2022/0343861 A1* | 10/2022 | Feng | .................... | G09G 3/3266 |
| 2022/0383792 A1* | 12/2022 | Feng | .................... | G11C 19/28 |

FOREIGN PATENT DOCUMENTS

| | | |
|---|---|---|
| CN | 109166527 A | 1/2019 |
| CN | 109935185 A | 6/2019 |
| CN | 109935187 A | 6/2019 |
| CN | 109935199 A | 6/2019 |
| CN | 109935208 A | 6/2019 |
| CN | 109935209 A | 6/2019 |
| CN | 110858469 A | 3/2020 |
| CN | 111261116 A | 6/2020 |
| KR | 10-2018-0128123 A | 12/2018 |
| WO | 2020038125 A1 | 2/2020 |

* cited by examiner

SHIFT REGISTER UNIT AND DRIVING METHOD THEREFOR, GATE DRIVING CIRCUIT AND DISPLAY DEVICE

CROSS-REFERENCE TO RELATED APPLICATIONS

This application is a national phase entry under 35 USC 371 of International Patent Application No. PCT/CN2021/085208, filed on Apr. 2, 2021, which claims priority to Chinese Patent Application No. 202010256051.6, filed on Apr. 2, 2020, which are incorporated herein by reference in their entirety.

TECHNICAL FIELD

The present disclosure relates to the field of display technologies, and in particular, to a shift register unit and a driving method therefor, a gate driving circuit, and a display device.

BACKGROUND

With a development of display technologies, high-resolution, narrow-bezel display devices have become one of the mainstream development trends in the display field. To this end, the display device adopts a gate driver on array (abbreviated as GOA) circuit, i.e., a circuit formed by directly integrating a gate driving circuit in a non-display region on an array substrate of the display device, which may replace a driving chip externally connected to the array substrate. Therefore, the display device has advantages such as low cost, less working procedure and high productivity.

SUMMARY

In an aspect, a shift register unit is provided. The shift register unit includes a first input/output unit and a second input/output unit.

The first input/output unit includes a first pull-down control circuit and a first auxiliary input circuit. The first pull-down control circuit is coupled to a first pull-up node and a first pull-down node. The first auxiliary input circuit is coupled to the first pull-down control circuit. The first auxiliary input circuit is configured to control the first pull-down control circuit together with a level of the first pull-up node in response to a display control signal and a blanking control signal. The first pull-down control circuit is configured to control a level of the first pull-down node under control of both the level of the first pull-up node and the first auxiliary input circuit.

The second input/output unit includes a second pull-down control circuit and a second auxiliary input circuit. The second pull-down control circuit is coupled to a second pull-up node and a second pull-down node. The second auxiliary input circuit is coupled to the second pull-down control circuit. The second auxiliary input circuit is configured to control the second pull-down control circuit together with a level of the second pull-up node in response to the display control signal and the blanking control signal. The second pull-down control circuit is configured to control a level of the second pull-down node under control of both the level of the second pull-up node and the second auxiliary input circuit.

In some embodiments, the first pull-down control circuit includes a first transistor, a second transistor, a third transistor and a fourth transistor. A control electrode of the first transistor is coupled to a first voltage terminal, a first electrode of the first transistor is coupled to the first voltage terminal, and a second electrode of the first transistor is coupled to a first auxiliary node and a control electrode of the second transistor. A first electrode of the second transistor is coupled to the first voltage terminal, and a second electrode of the second transistor is coupled to the first pull-down node. A control electrode of the third transistor is coupled to the first pull-up node, a first electrode of the third transistor is coupled to the first auxiliary node, and a second electrode of the third transistor is coupled to a second voltage terminal. A control electrode of the fourth transistor is coupled to the first pull-up node, a first electrode of the fourth transistor is coupled to the first pull-down node, and a second electrode of the fourth transistor is coupled to the second voltage terminal.

The first auxiliary input circuit includes a fifth transistor, a sixth transistor and a seventh transistor. A control electrode of the fifth transistor is coupled to a display control signal terminal, a first electrode of the fifth transistor is coupled to the first auxiliary node, and a second electrode of the fifth transistor is coupled to the second voltage terminal. A to control electrode of the sixth transistor is coupled to a first clock signal terminal, a first electrode of the sixth transistor is coupled to the first auxiliary node, and a second electrode of the sixth transistor is coupled to a first electrode of the seventh transistor. A control electrode of the seventh transistor is coupled to a blanking pull-up control node, and a second electrode of the seventh transistor is coupled to the second voltage terminal.

In some embodiments, the second pull-down control circuit includes an eighth transistor, a ninth transistor, a tenth transistor and an eleventh transistor. A control electrode of the eighth transistor is coupled to a third voltage terminal, a first electrode of the eighth transistor is coupled to the third voltage terminal, and a second electrode of the eighth transistor is coupled to a second auxiliary node and a control electrode of the ninth transistor. A first electrode of the ninth transistor is coupled to the third voltage terminal, and a second electrode of the ninth transistor is coupled to the second pull-down node. A control electrode of the tenth transistor is coupled to the second pull-up node, a first electrode of the tenth transistor is coupled to the second auxiliary node, and a second electrode of the tenth transistor is coupled to a second voltage terminal. A control electrode of the eleventh transistor is coupled to the second pull-up node, a first electrode of the eleventh transistor is coupled to the second pull-down node, and a second electrode of the eleventh transistor is coupled to the second voltage terminal.

The second auxiliary input circuit includes a twelfth transistor, a thirteenth transistor and a fourteenth transistor. A control electrode of the twelfth transistor is coupled to a display control signal terminal, a first electrode of the twelfth transistor is coupled to the second auxiliary node, and a second electrode of the twelfth transistor is coupled to the second voltage terminal. A control electrode of the thirteenth transistor is coupled to a first clock signal terminal, a first electrode of the thirteenth transistor is coupled to the second auxiliary node, and a second electrode of the thirteenth transistor is coupled to a first electrode of the fourteenth transistor. A control electrode of the fourteenth transistor is coupled to a blanking pull-up control node, and a second electrode of the fourteenth transistor is coupled to the second voltage terminal.

In some other embodiments, the first pull-down control circuit includes a first transistor, a second transistor, a third transistor and a fourth transistor. A control electrode of the first transistor is coupled to a first voltage terminal, a first electrode of the first transistor is coupled to the first voltage terminal, and a second electrode of the first transistor is coupled to a first auxiliary node and a control electrode of the second transistor. A first electrode of the second transistor is coupled to the first voltage terminal, and a second electrode of the second transistor is coupled to the first pull-down node. A control electrode of the third transistor is coupled to the first pull-up node, a first electrode of the third transistor is coupled to the first auxiliary node, and a second electrode of the third transistor is coupled to a second voltage terminal. A control electrode of the fourth transistor is coupled to the first pull-up node, a first electrode of the fourth transistor is coupled to the first pull-down node, and a second electrode of the fourth transistor is coupled to the second voltage terminal.

The second pull-down control circuit includes an eighth transistor, a ninth transistor, a tenth transistor and an eleventh transistor. A control electrode of the eighth transistor is coupled to a third voltage terminal, a first electrode of the eighth transistor is coupled to the third voltage terminal, and a second electrode of the eighth transistor is coupled to a second auxiliary node and a control electrode of the ninth transistor. A first electrode of the ninth transistor is coupled to the third voltage terminal, and a second electrode of the ninth transistor is coupled to the second pull-down node. A control electrode of the tenth transistor is coupled to the second pull-up node, a first electrode of the tenth transistor is coupled to the second auxiliary node, and a second electrode of the tenth transistor is coupled to the second voltage terminal. A control electrode of the eleventh transistor is coupled to the second pull-up node, a first electrode of the eleventh transistor is coupled to the second pull-down node, and a second electrode of the eleventh transistor is coupled to the second voltage terminal.

The first auxiliary input circuit includes a fifth transistor, a sixth transistor and a seventh transistor. A control electrode of the fifth transistor is coupled to a display control signal terminal, a first electrode of the fifth transistor is coupled to the first auxiliary node, and a second electrode of the fifth transistor is coupled to the second voltage terminal. A control electrode of the sixth transistor is coupled to a first clock signal terminal, a first electrode of the sixth transistor is coupled to the first auxiliary node, and a second electrode of the sixth transistor is coupled to a third auxiliary node. A control electrode of the seventh transistor is coupled to a blanking pull-up control node, a first electrode of the seventh transistor is coupled to the third auxiliary node, and a second electrode of the seventh transistor is coupled to the second voltage terminal.

The second auxiliary input circuit includes a twelfth transistor and a fourteenth transistor. A control electrode of the twelfth transistor is coupled to the display control signal terminal, a first electrode of the twelfth transistor is coupled to the second auxiliary node, and a second electrode of the twelfth transistor is coupled to the second voltage terminal. A control electrode of the fourteenth transistor is coupled to the blanking pull-up control node, a first electrode of the fourteenth transistor is coupled to the third auxiliary node, and a second electrode of the fourteenth transistor is coupled to the second voltage terminal.

In some embodiments, the first input/output unit further includes a third auxiliary input circuit. The second input/output unit further includes a fourth auxiliary input circuit. The third auxiliary input circuit is coupled to the first pull-down node, and the third auxiliary input circuit is configured to control the level of the first pull-down node in response to the display control signal and the blanking control signal. The fourth auxiliary input circuit is coupled to the second pull-down node, and the fourth auxiliary input circuit is configured to control the level of the second pull-down node in response to the display control signal and the blanking control signal.

In some embodiments, the third auxiliary input circuit includes a fifteenth transistor, a sixteenth transistor and a seventeenth transistor. A control electrode of the fifteenth transistor is coupled to the display control signal terminal, a first electrode of the fifteenth transistor is coupled to the first pull-down node, and a second electrode of the fifteenth transistor is coupled to a second voltage terminal. A control electrode of the sixteenth transistor is coupled to the first clock signal terminal, a first electrode of the sixteenth transistor is coupled to the first pull-down node, and a second electrode of the sixteenth transistor is coupled to a first electrode of the seventeenth transistor. A control electrode of the seventeenth transistor is coupled to the blanking pull-up control node, and a second electrode of the seventeenth transistor is coupled to the second voltage terminal.

In some embodiments, the fourth auxiliary input circuit includes an eighteenth transistor, a nineteenth transistor and a twentieth transistor. A control electrode of the eighteenth transistor is coupled to the display control signal terminal, a first electrode of the eighteenth transistor is coupled to a second pull-down node, and a second electrode of the eighteenth transistor is coupled to the second voltage terminal. A control electrode of the nineteenth transistor is coupled to the first clock signal terminal, a first electrode of the nineteenth transistor is coupled to the second pull-down node, and a second electrode of the nineteenth transistor is coupled to a first electrode of the twentieth transistor. A control electrode of the twentieth transistor is coupled to the blanking pull-up control node, and a second electrode of the twentieth transistor is coupled to the second voltage terminal.

In some other embodiments, the first pull-down control circuit includes a first transistor, a second transistor, a third transistor and a fourth transistor; a control electrode of the first transistor is coupled to a first voltage terminal, a first electrode of the first transistor is coupled to the first voltage terminal, and a second electrode of the first transistor is coupled to a first auxiliary node and a control electrode of the second transistor; a first electrode of the second transistor is coupled to the first voltage terminal, and a second electrode of the second transistor is coupled to the first pull-down node; a control electrode of the third transistor is coupled to the first pull-up node, a first electrode of the third transistor is coupled to the first auxiliary node, and a second electrode of the third transistor is coupled to a second voltage terminal; and a control electrode of the fourth transistor is coupled to the first pull-up node, a first electrode of the fourth transistor is coupled to the first pull-down node, and a second electrode of the fourth transistor is coupled to the second voltage terminal. The second pull-down control circuit includes an eighth transistor, a ninth transistor, a tenth transistor and an eleventh transistor; a control electrode of the eighth transistor is coupled to a third voltage terminal, a first electrode of the eighth transistor is coupled to the third voltage terminal, and a second electrode of the eighth transistor is coupled to a second auxiliary node and a control electrode of the ninth transistor; a first electrode of the ninth transistor is coupled to the third voltage terminal, and a second electrode of the ninth transistor is coupled to the second pull-down node; a control electrode of the tenth transistor is coupled to the second pull-up node, a first electrode of the tenth transistor is coupled to the second auxiliary node, and a second electrode of the tenth transistor is coupled to the second voltage terminal; and a control electrode of the eleventh transistor is coupled to the second pull-up node, a first electrode of the eleventh transistor is coupled to the second pull-down node, and a second electrode of the eleventh transistor is coupled to the second voltage terminal. The first auxiliary input circuit includes a fifth transistor, a sixth transistor and a seventh transistor; a control electrode of the fifth transistor is coupled to a display control signal terminal, a first electrode of the fifth transistor is coupled to the first auxiliary node, and a second electrode of the fifth transistor is coupled to the second voltage terminal; a control electrode of the sixth transistor is coupled to a first clock signal terminal, a first electrode of the sixth transistor is coupled to the first auxiliary node, and a second electrode of the sixth transistor is coupled to a third auxiliary node; and a control electrode of the seventh transistor is coupled to a blanking pull-up control node, a first electrode of the seventh transistor is coupled to the third auxiliary node, and a second electrode of the seventh transistor is coupled to the second voltage terminal. The second auxiliary input circuit includes a twelfth transistor and a fourteenth transistor; a control electrode of the twelfth transistor is coupled to the display control signal terminal, a first electrode of the twelfth transistor is coupled to the second auxiliary node, and a second electrode of the twelfth transistor is coupled to the second voltage terminal; and a control electrode of the fourteenth transistor is coupled to the blanking pull-up control node, a first electrode of the fourteenth transistor is coupled to the third auxiliary node, and a second electrode of the fourteenth transistor is coupled to the second voltage terminal. The first auxiliary input circuit is coupled to the third auxiliary node, the third auxiliary input circuit includes the fifteenth transistor and the seventeenth transistor. The control electrode of a fifteenth transistor and a seventeenth transistor. A control electrode of the fifteenth transistor is coupled to the display control signal terminal, a first electrode of the fifteenth transistor is coupled to the first pull-down node, and a second electrode of the fifteenth transistor is coupled to the second voltage terminal. A control electrode of the seventeenth transistor coupled to the blanking pull-up control node, a first electrode of the seventeenth transistor is coupled to the third auxiliary node, and a second electrode of the seventeenth transistor is coupled to the second voltage terminal.

The fourth auxiliary input circuit includes an eighteenth transistor and a twentieth transistor. A control electrode of the eighteenth transistor is coupled to the display control signal terminal, a first electrode of the eighteenth transistor is coupled to the second pull-down node, and a second electrode of the eighteenth transistor is coupled to the second voltage terminal. A control electrode of the twentieth transistor is coupled to the blanking pull-up control node, a first electrode of the twentieth transistor is coupled to the third auxiliary node, and a second electrode of the twentieth transistor is coupled to the second voltage terminal.

In some embodiments, the shift register unit further includes a blanking input circuit and a display input circuit. The blanking input circuit is coupled to the first pull-up node and the second pull-up node, and the blanking input circuit is configured to charge the first pull-up node and the second pull-up node in response to the blanking control signal. The display input circuit is coupled to the first pull-up node and the second pull-up node, and the display input circuit is configured to charge the first pull-up node and the second pull-up node in response to the display control signal. The first input/output unit has a first output terminal. The first input/output unit is configured to output a first composite output signal to the first output terminal under a control of the level of the first pull-up node. The second input/output unit has a second output terminal. The second input/output unit is configured to output a second composite output signal to the second output terminal under control of the level of the second pull-up node.

In some embodiments, the shift register unit further includes a compensation selection circuit. The compensation selection circuit is coupled to the blanking input circuit, and the compensation selection circuit is configured to output a blanking pull-up control signal in the blanking control signal to the blanking input circuit in response to a compensation selection control signal.

In some embodiments, the first input/output unit further includes a first pull-down circuit, a first output circuit, a first display reset circuit and a first global reset circuit. The second input/output unit further includes a second pull-down circuit, a second output circuit, a second display reset circuit and a second global reset circuit.

The first pull-down circuit is coupled to the first pull-down node, the first pull-up node and the first output terminal, and the first pull-down circuit is configured to pull-down levels of the first pull-up node and the first output terminal under control of the level of the first pull-down node to reset the first pull-up node and the first output terminal.

The first output circuit is coupled to the first pull-up node and the first output terminal, and the first output circuit is configured to output the first composite output signal to the first output terminal under the control of the level of the first pull-up node.

The first display reset circuit is coupled to a display reset signal terminal, the first pull-up node and a second voltage terminal, and the first display reset circuit is configured to output a signal provided via the second voltage terminal received from the display reset signal terminal to the first pull-up node in response to the display reset signal, so as to reset the level of the first pull-up node.

The first global reset circuit is coupled to a global reset signal terminal, the first pull-up node and the second voltage terminal, and the first global reset circuit is configured to output the signal provided via the second voltage terminal received from the global reset signal terminal, to the first pull-up node in response to the global reset signal so as to reset the level of the first pull-up node.

The second output circuit is coupled to the second pull-up node and the second output terminal, and the second output circuit is configured to output the second composite output signal to the second output terminal under the control of the level of the second pull-up node.

The second pull-down circuit is coupled to the second pull-up node, the second output terminal and the second pull-down node, and the second pull-down circuit is configured to pull-down levels of the second pull-up node and the second output terminal under control of the level of the second pull-down node to reset the second pull-up node and the second output terminal.

The second display reset circuit is coupled to the display reset signal terminal, the second pull-up node and the second voltage terminal, and the second display reset circuit is configured to output the signal provided via the second voltage terminal received from the display reset signal terminal to the second pull-up node in response to the display reset signal, so as to reset the level of the second pull-up node.

The second global reset circuit is coupled to the global reset signal terminal, the second pull-up node and the second voltage terminal, and the second global reset circuit is configured to output the signal provided via the second voltage terminal received from the global reset signal terminal to the second pull-up node in response to the global reset signal, so as to reset the level of the second pull-up node.

In some embodiments, the first output circuit includes a thirty-fifth transistor, a thirty-sixth transistor, a thirty-seventh transistor, a second capacitor and a third capacitor. A control electrode of the thirty-fifth transistor is coupled to the first pull-up node, a first electrode of the thirty-fifth transistor is coupled to a second clock signal terminal, and a second electrode of the thirty-fifth transistor is coupled to a shift signal output terminal. A control electrode of the thirty-sixth transistor is coupled to the first pull-up node, a first electrode of the thirty-sixth transistor is coupled to a third clock signal terminal, and a second electrode of the thirty-sixth transistor is coupled to a first pixel scanning signal output terminal. A control electrode of the thirty-seventh transistor is coupled to the first pull-up node, a first electrode of the thirty-seventh transistor is coupled to a fourth clock signal terminal, and a second electrode of the thirty-seventh transistor is coupled to a second pixel scanning signal output terminal. A first electrode of the second capacitor is coupled to the control electrode of the thirty-sixth transistor, and a second electrode of the second capacitor is coupled to the first pixel scanning signal output terminal. A first electrode of the third capacitor is coupled to the control electrode of the thirty-seventh transistor, and a second electrode of the third capacitor is coupled to the second pixel scanning signal output terminal.

The first pull-down circuit includes a twenty-seventh transistor, a twenty-eighth transistor, a twenty-ninth transistor, a thirtieth transistor, a thirty-first transistor, a thirty-second transistor, a thirty-third transistor and a thirty-fourth transistor. A control electrode of the twenty-seventh transistor is coupled to the second pull-down node, a first electrode of the twenty-seventh transistor is coupled to the first pull-up node, and a second electrode of the twenty-seventh transistor is coupled to the second voltage terminal. A control electrode of the twenty-eighth transistor is coupled to the first pull-down node, a first electrode of the twenty-eighth transistor is coupled to the first pull-up node, and a second electrode of the twenty-eighth transistor is coupled to the second voltage terminal. A control electrode of the twenty-ninth transistor is coupled to the first pull-down node, a first electrode of the twenty-ninth transistor is coupled to the shift signal output terminal, and a second electrode of the twenty-ninth transistor is coupled to the second voltage terminal. A control electrode of the thirtieth transistor is coupled to the second pull-down node, a first electrode of the thirtieth transistor is coupled to the shift signal output terminal, and a second electrode of the thirtieth transistor is coupled to the second voltage terminal. A control electrode of the thirty-first transistor is coupled to the first pull-down node, a first electrode of the thirty-first transistor is coupled to the first pixel scanning signal output terminal, and a second electrode of the thirty-first transistor is coupled to a fourth voltage terminal. A control electrode of the thirty-second transistor is coupled to the second pull-down node, a first electrode of the thirty-second transistor is coupled to the first pixel scanning signal output terminal, and a second electrode of the thirty-second transistor is coupled to the fourth voltage terminal. A control electrode of the thirty-third transistor is coupled to the first pull-down node, a first electrode of the thirty-third transistor is coupled to the second pixel scanning signal output terminal, and a second electrode of the thirty-third transistor is coupled to the fourth voltage terminal. A control electrode of the thirty-fourth transistor is coupled to the second pull-down node, a first electrode of the thirty-fourth transistor is coupled to the second pixel scanning signal output terminal, and a second electrode of the thirty-fourth transistor is coupled to the fourth voltage terminal.

The first display reset circuit includes a thirty-eighth transistor. The control electrode of the thirty-eighth transistor is coupled to the display reset signal terminal, a first electrode of the thirty-eighth transistor is coupled to the first pull-up node, and a second electrode of the thirty-eighth transistor is coupled to the second voltage terminal.

The first global reset circuit includes a thirty-ninth transistor. A control electrode of the thirty-ninth transistor is coupled to the global reset signal terminal, a first electrode of the thirty-ninth transistor is coupled to the first pull-up node, and a second electrode of the thirty-ninth transistor is coupled to the second voltage terminal.

In some embodiments, the second output circuit includes a forty-sixth transistor, a forty-seventh transistor, a fourth capacitor and a fifth capacitor. A control electrode of the forty-sixth transistor is coupled to the second pull-up node, a first electrode of the forty-sixth transistor is coupled to a fifth clock signal terminal, and a second electrode of the forty-sixth transistor is coupled to a third pixel scanning signal output terminal. A control electrode of the forty-seventh transistor is coupled to the second pull-up node, a first electrode of the forty-seventh transistor is coupled to a sixth clock signal terminal, and a second electrode of the forty-seventh transistor is coupled to a fourth pixel scanning signal output terminal. A first electrode of the fourth capacitor is coupled to the control electrode of the forty-sixth transistor, and a second electrode of the fourth capacitor is coupled to the third pixel scanning signal output terminal. A first electrode of the fifth capacitor is coupled to the control electrode of the forty-seventh transistor, and a second electrode of the fifth capacitor is coupled to the fourth pixel scanning signal output terminal.

The second pull-down circuit includes a fortieth transistor, a forty-first transistor, a forty-second transistor, a forty-third transistor, a forty-fourth transistor and a forty-fifth transistor. A control electrode of the fortieth transistor is coupled to the first pull-down node, a first electrode of the fortieth transistor is coupled to the second pull-up node, and a second electrode of the fortieth transistor is coupled to the second voltage terminal. A control electrode of the forty-first transistor is coupled to the second pull-down node, a first electrode of the forty-first transistor is coupled to the second pull-up node, and a second electrode of the forty-first transistor is coupled to the second voltage terminal. A control electrode of the forty-second transistor is coupled to the second pull-down node, a first electrode of the forty-second transistor is coupled to the third pixel scanning signal output terminal, and a second electrode of the forty-second transistor is coupled to the fourth voltage terminal. A control electrode of the forty-third transistor is coupled to the first pull-down node, a first electrode of the forty-third transistor is coupled to the third pixel scanning signal output terminal, and a second electrode of the forty-third transistor is coupled to the fourth voltage terminal. A control electrode of the forty-fourth transistor is coupled to the second pull-down node, a first electrode of the forty-fourth transistor is coupled to the fourth pixel scanning signal output terminal, and a second electrode of the forty-fourth transistor is coupled to the fourth voltage terminal. A control electrode of the forty-fifth transistor is coupled to the first pull-down node, a first electrode of the forty-fifth transistor is coupled to the fourth pixel scanning signal output terminal, and a second electrode of the forty-fifth transistor is coupled to the fourth voltage terminal.

The second display reset circuit includes a forty-eighth transistor. A control electrode of the forty-eighth transistor is coupled to the display reset signal terminal, a first electrode of the forty-eighth transistor is coupled to the second pull-up node, and a second electrode of the forty-eighth transistor is coupled to the second voltage terminal.

The second global reset circuit includes a forty-ninth transistor. A control electrode of the forty-ninth transistor is coupled to the global reset signal terminal, a first electrode of the forty-ninth transistor is coupled to the second pull-up node, and a second electrode of the forty-ninth transistor is coupled to the second voltage terminal.

In some embodiments, the blanking input circuit includes a twenty-second transistor, a twenty-third transistor and a twenty-fourth transistor. A control electrode of the twenty-second transistor is coupled to a blanking pull-up control node, a first electrode of the twenty-second transistor is coupled to the first clock signal terminal, and a second electrode of the twenty-second transistor is coupled to the blanking pull-up node. A control electrode of the twenty-third transistor is coupled to the first clock signal terminal, a first electrode of the twenty-third transistor is coupled to the blanking pull-up node, and a second electrode of the twenty-third transistor is coupled to the first pull-up node. A control electrode of the twenty-fourth transistor is coupled to the first clock signal terminal, a first electrode of the twenty-fourth transistor is coupled to the blanking pull-up node, and a second electrode of the twenty-fourth transistor is coupled to the second pull-up node.

The display input circuit includes a twenty-fifth transistor and a twenty-sixth transistor. A control electrode of the twenty-fifth transistor is coupled to the display control signal terminal, a first electrode of the twenty-fifth transistor is coupled to the display control signal terminal, and a second electrode of the twenty-fifth transistor is coupled to the first pull-up node. A control electrode of the twenty-sixth transistor is coupled to the display control signal terminal, a first electrode of the twenty-sixth transistor is coupled to the display control signal terminal, and a second electrode of the twenty-sixth transistor is coupled to the second pull-up node.

In some embodiments, the compensation selection circuit includes a twenty-first transistor and a first capacitor. The control electrode of the twenty-first transistor is coupled to a compensation selection control signal terminal, a first electrode of the twenty-first transistor is coupled to the display control signal terminal, and a second electrode of the twenty-first transistor is coupled to the blanking pull-up control node. A first electrode of the first capacitor is coupled to the blanking pull-up control node, and a second electrode of the first capacitor is coupled to the second voltage terminal.

In another aspect, a gate driving circuit is provided. The gate driving circuit includes a plurality of shift register units according to any one of the above embodiments provided by the above technical solutions which are cascaded.

In yet another aspect, a display device is provided. The display device includes the gate driving circuit provided by the above technical solutions and a plurality of sub-pixel units arranged in an array. A first output terminal and a second output terminal of each shift register unit of the gate driving circuit are coupled to different rows of sub-pixel units.

In yet another aspect, a driving method for a shift register unit is provided. The driving method for the shift register unit includes:

in a display input period of a frame period, charging, by a display input circuit, the first pull-up node and the second pull-up node in response to the display control signal, with the first auxiliary input circuit and the second auxiliary input circuit being turned on in response to the display control signal; pulling down, by the first pull-down control circuit, the level of the first pull-down node under the control of both the level of the first pull-up node and the first auxiliary input circuit, so as to turn off a first pull-down circuit; and pulling down, by the second pull-down control circuit, the level of the second pull-down node under the control of both the level of the second pull-up node and the second auxiliary input circuit, so as to turn off a second pull-down circuit; and in a blanking input period of the frame period, charging, by a blanking input circuit, the first pull-up node and the second pull-up node in response to the blanking control signal, with the first auxiliary input circuit and the second auxiliary input circuit being turned on in response to the blanking control signal; pulling down, by the first pull-down control circuit, the level of the first pull-down node under the control of both the level of the first pull-up node and the first auxiliary input circuit, so as to turn off the first pull-down circuit; and pulling down, by the second pull-down control circuit, the level of the second pull-down node under the control of both the level of the second pull-up node and the second auxiliary input circuit, so as to turn off the second pull-down circuit.

In some embodiments, in a case where the first input/output unit further includes a third auxiliary input circuit, the second input/output unit further includes a fourth auxiliary input circuit. The driving method for the shift register unit further includes:

in the display input period, directly pulling down, by the third auxiliary input circuit, the level of the first pull-down node in response to the display control signal, so as to turn off the first pull-down circuit; and directly pulling down, by the fourth auxiliary input circuit, the level of the second pull-down node in response to the display control signal, so as to turn off the second pull-down circuit; and in the blanking input period, directly pulling down, by the third auxiliary input circuit, the level of the first pull-down node in response to the blanking control signal, so as to turn off the first pull-down circuit; and directly pulling down, by the fourth auxiliary input circuit, the level of the second pull-down node in response to the blanking control signal, so as to turn off the second pull-down circuit.

In some embodiments, the first input/output unit further includes a third auxiliary input circuit, and the second input/output unit further includes a fourth auxiliary input circuit. The third auxiliary input circuit is coupled to the first pull-down node, and the third auxiliary input circuit is configured to control the level of the first pull-down node in response to the display control signal and the blanking control signal. The fourth auxiliary input circuit is coupled to the second pull-down node, and the fourth auxiliary input circuit is configured to control the level of the second pull-down node in response to the display control signal and the blanking control signal. The first auxiliary input circuit is coupled to the third auxiliary node, the third auxiliary input circuit includes a fifteenth transistor and a seventeenth transistor; a control electrode of the fifteenth transistor is coupled to the display control signal terminal, a first electrode of the fifteenth transistor is coupled to the first pull-down node, and a second electrode of the fifteenth transistor is coupled to the second voltage terminal; and a control electrode of the seventeenth transistor is coupled to the blanking pull-up control node, a first electrode of the seventeenth transistor is coupled to the third auxiliary node, and a second electrode of the seventeenth transistor is coupled to the second voltage terminal. The fourth auxiliary input circuit includes an eighteenth transistor and a twentieth transistor; a control electrode of the eighteenth transistor is coupled to the display control signal terminal, a first electrode of the eighteenth transistor is coupled to the second pull-down node, and a second electrode of the eighteenth transistor is coupled to the second voltage terminal; and a control electrode of the twentieth transistor is coupled to the blanking pull-up control node, a first electrode of the twentieth transistor is coupled to the third auxiliary node, and a second electrode of the twentieth transistor is coupled to the second voltage terminal.

BRIEF DESCRIPTION OF THE DRAWINGS

In order to describe technical solutions in the present disclosure more clearly, accompanying drawings to be used in some embodiments of the present disclosure will be introduced briefly below. However, the accompanying drawings to be described below are merely accompanying drawings of some embodiments of the present disclosure, and a person of ordinary skill in the art can obtain other drawings according to these accompanying drawings. The accompanying drawings are used to provide further understanding of the embodiments of the present disclosure and constitute a part of the embodiments of the present disclosure. The exemplary embodiments in the present disclosure and the descriptions thereof serve to explain the present disclosure, and are not limitations on an actual size of a product, an actual process of a method and an actual timing of a signal involved in the embodiments of the present disclosure. In the accompanying drawings.

DETAILED DESCRIPTION

Figure 1:
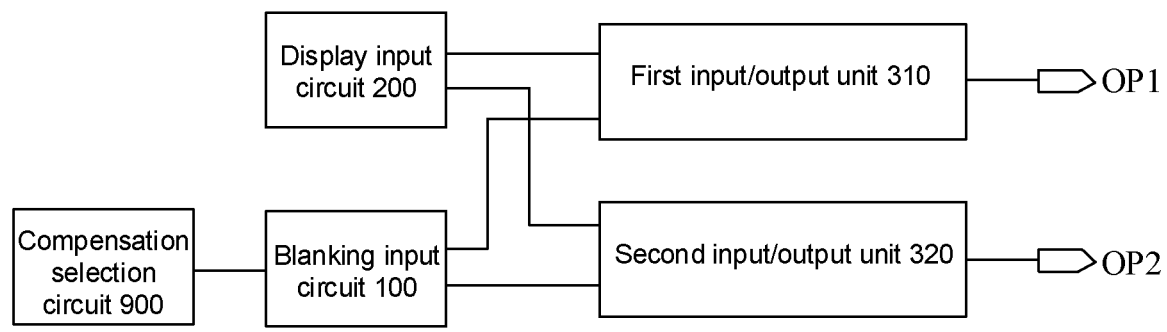
FIG. 1 is a structural diagram of a shift register unit in some embodiments of the related art.

For convenience of understanding, a shift register unit, a gate driving circuit, a display device and a driving method for the shift register unit provided in embodiments of the present disclosure will be described in detail below with reference to the accompanying drawings.

The terms "first", "second" and the like used in the embodiments of the present disclosure are not intended to mean any order, quantity or importance, and are merely used to distinguish different components. Similarly, the term such as "include" or "comprise" means that an element or item appearing before the word covers the element(s) or item(s) appearing after the word and the equivalent thereof without excluding other elements or items. In the description, the term such as "one embodiment", "some embodiments", "exemplary embodiments", "example", "specific example" or "some examples" is intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

In the description of some embodiments, the terms "coupled" and "connected" and derivatives thereof may be used. For example, the term "connected" may be used in the description of some embodiments to indicate that two or more components are in direct physical or electrical contact with each other. As another example, the term "coupled" may be used in the description of some embodiments to indicate that two or more components are in direct physical or electrical contact with each other. However, the term "coupled" or "communicatively coupled" may also mean that two or more components are not in direct contact with each other, but still cooperate or interact with each other. The embodiments disclosed herein are not necessarily limited to the content herein.

In addition, the phrase "applicable to" or "configured to" used herein has an open and inclusive meaning, which does not exclude devices that are applicable to or configured to perform additional tasks or steps.

Transistors adopted in embodiments of the present disclosure may be thin film transistors or field-effect transistors or other devices having same properties. In these embodiments, a drain electrode and a source electrode of each transistor may be interchangeable in connection relationship. That is, the drain electrode and the source electrode of each transistor in the embodiments of the present disclosure are actually indistinguishable. Herein, one of two electrodes is referred to as the drain electrode, and another electrode is referred to as the source electrode only to distinguish between the two electrodes of the transistor except a control electrode (i.e., a gate electrode). A thin film transistor adopted in the embodiments of the present disclosure may be an N-type transistor or a P-type transistor. In the embodiments of the present disclosure, in a case where a thin film transistor is an N-type thin film transistor, a first electrode of the thin film transistor may be a source electrode and a second electrode of the thin film transistor may be a drain electrode. The following embodiments are described by taking an example in which the thin film transistors are the N-type transistors. That is, in a case where a signal at the control electrode is at a high level, the thin film transistor is turned on. It will be appreciated that, in a case where the P-type transistor is used, timing of driving signals needs to be adjusted accordingly. Specific details will not be described here, but should also be within the protection scope of the invention.

Some embodiments of the present disclosure provide a display device. The display device may be any device that displays an image whether in motion (e.g., a video) or stationary (e.g., a still image), and whether literal or graphical. More specifically, it is anticipated that the embodiments may be implemented in or associated with a variety of electronic devices. The variety of electronic devices may be (but not limited to), for example, mobile telephones, wireless devices, personal data assistants (PDAs), hand-held or portable computers, global positioning system (GPS) receivers/navigators, cameras, MPEG-4 Part 14 (MP4) video players, video cameras, game consoles, watches, clocks, calculators, television monitors, flat-panel displays, computer monitors, auto displays (e.g., odometer displays, etc.), navigators, cockpit controllers and/or displays, camera view displays (e.g., rear view camera displays in vehicles), electronic photos, electronic billboards or signs, projectors, building structures, and packaging and aesthetic structures (e.g., displays of images of a piece of jewelry).

The display device generally includes a display driving circuit and a plurality of sub-pixel units arranged in an array. The display driving circuit is configured to drive the plurality of sub-pixel units arranged in the array, so that the display device performs image display. In some examples, the display driving circuit includes a source driving circuit and gate driving circuit(s). The gate driving circuit includes a plurality of shift register units. A shift register of a shift register unit is mainly composed of transistors, capacitors and other components. In a working process of the shift register, potentials at internal control nodes are controlled through the transistors and the capacitors, so that a scanning signal is output.

For example, the display device may be any one of a liquid crystal display (abbreviated as LCD) device, a light-emitting diode (abbreviated as LED) display device, an organic light-emitting diode (abbreviated as OLED) display device, a micro light-emitting diode (abbreviated as micro LED) display device or a mini light-emitting diode (abbreviated as mini LED) display device, which is not specifically limited in the embodiments of the present disclosure.

The following embodiments of the present disclosure are illustrated by taking an example in which the display device is an OLED display device.

In a case where compensation is performed for each sub-pixel unit, except for an internal compensation performed by providing a pixel compensation circuit in the sub-pixel unit, an external compensation may also be performed by providing a sensing transistor in the sub-pixel unit. In this way, when the external compensation is performed, the gate driving circuit composed of the shift register units needs to provide, for each of the scanning transistor and the sensing transistor in the sub-pixel unit of a display panel, a corresponding driving signal. For example, the gate driving circuit provides a scanning driving signal for the scanning transistor in a display period of a frame, and provides a sensing driving signal for the sensing transistor in a blanking period of the frame.

In an external compensation manner, for the sensing driving signals output by the gate driving circuit, a progressive scan method is used. For example, a sensing driving signal is output to a first row of sub-pixel units of the display panel in a blanking period of a first frame, another sensing driving signal is output to a second row of sub-pixel units of the display panel in a blanking period of a second frame, and so forth. That is, in each frame, a sensing driving signal is output to a respective row of sub-pixel units, so that sensing driving signals are output row by row. In this way, a row-by-row compensation is completed for the display panel.

Figure 2:
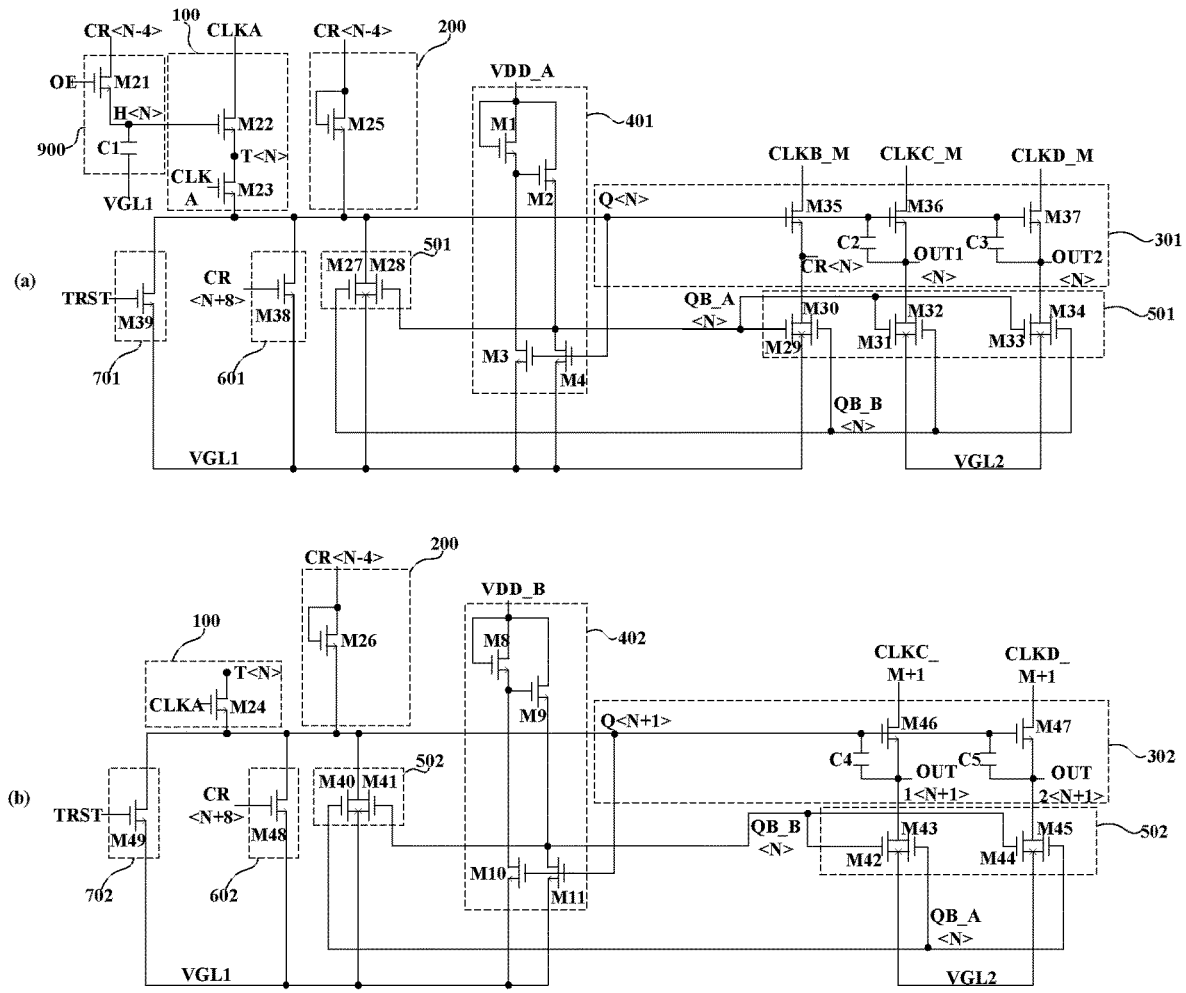
FIG. 2 is a configuration diagram of another shift register unit in some embodiments of the related art.

Based on this, in the related art, a shift register unit as shown in FIGS. 1 and 2 is provided. The shift register unit includes a compensation selection circuit 900, a blanking input circuit 100, a display input circuit 200, a first input/output unit 310, and a second input/output unit 320. The first input/output unit 310 includes a first pull-up node Q<N> and has a first output terminal OP1, and the second input/output unit 320 includes a second pull-up node Q<N+1> and has a second output terminal OP2. Structures of the first output terminal OP1 and the second output terminal OP2 may be the same or different. Optionally, the first output terminal OP1 includes a shift signal output terminal CR<N> and at least one pixel scanning signal output terminal OUT<N>, so that a composite output signal is output via the shift signal output terminal CR<N> and the pixel scanning signal output terminal OUT<N>. The second output terminal OP2 includes at least two pixel scanning signal output terminals OUT<N+1>, so that another composite output signal is output via the pixel scanning signal output terminals OUT<N+1>.

The compensation selection circuit 900 is coupled to the blanking input circuit 100. The compensation selection circuit 900 is configured to generate a blanking pull-up control signal in response to a compensation selection control signal, and output the blanking pull-up control signal to the blanking input circuit 100.

For example, the compensation selection circuit 900 includes a twenty-first transistor M21 and a first capacitor C1. A control electrode of the twenty-first transistor M21 is coupled to a compensation selection control signal terminal OE, a first electrode of the twenty-first transistor M21 is coupled to a display control signal terminal CR<N−4>, and a second electrode of the twenty-first transistor M21 is coupled to a blanking pull-up control node H<N>. A first electrode of the first capacitor C1 is coupled to the blanking pull-up control node H<N>, and a second electrode of the first capacitor C1 is coupled to a second voltage terminal VGL1. In the display period of the frame, the compensation selection circuit 900 may charge the blanking pull-up control node H<N> in response to the compensation selection control signal.

Here, the blanking pull-up control signal is included in a blanking control signal.

The blanking input circuit 100 is coupled to the first pull-up node Q<N> and the second pull-up node Q<N+1>. The blanking input circuit 100 is configured to charge the first pull-up node Q<N> and the second pull-up node Q<N+1> in response to the blanking control signal.

For example, the blanking input circuit 100 includes a twenty-second transistor M22, a twenty-third transistor M23 and a twenty-fourth transistor M24. A control electrode of the twenty-second transistor M22 is coupled to the blanking pull-up control node H<N>, a first electrode of the twenty-second transistor M22 is coupled to a first clock signal terminal CLKA, and a second electrode of the twenty-second transistor M22 is coupled to a blanking pull-up node T<N>. A control electrode of the twenty-third transistor M23 is coupled to the first clock signal terminal CLKA, a first electrode of the twenty-third transistor M23 is coupled to the blanking pull-up node T<N>, and a second electrode of the twenty-third transistor M23 is coupled to the first pull-up node Q<N>. A control electrode of the twenty-fourth transistor M24 is coupled to the first clock signal terminal CLKA, a first electrode of the twenty-fourth transistor M24 is coupled to the blanking pull-up node T<N>, and a second electrode of the twenty-fourth transistor M24 is coupled to the second pull-up node Q<N+1>.

The blanking input circuit 100 is of the above structure, and the blanking control signal further includes a first clock signal provided via the first clock signal terminal CLKA.

The display input circuit 200 is coupled to the first pull-up node Q<N> and the second pull-up node Q<N+1>. The display input circuit 200 is configured to charge the first pull-up node Q<N> and the second pull-up node Q<N+1> in response to a display control signal.

For example, the display input circuit 200 includes a twenty-fifth transistor M25 and a twenty-sixth transistor M26. A control electrode of the twenty-fifth transistor M25 are coupled to the display control signal terminal CR<N−4>, a first electrode of the twenty-fifth transistor M25 is coupled to the display control signal terminal CR<N−4>, and a second electrode of the twenty-fifth transistor M25 is coupled to the first pull-up node Q<N>. A control electrode of the twenty-sixth transistor M26 is coupled to the display control signal terminal CR<N−4>, a first electrode of the twenty-sixth transistor M26 is coupled to the display control signal terminal CR<N−4>, and a second electrode of the twenty-sixth transistor M26 is coupled to the second pull-up node Q<N+1>.

The first input/output unit 310 is configured to output a composite output signal to the first output terminal OP1 under control of a level of the first pull-up node Q<N>. For example, in the display period of the frame, the first input/output unit 310 may output a scanning driving signal, which may drive a certain row of sub-pixel units of the display panel to perform scanning display. As another example, in the blanking period of the frame, the first input/output unit 310 may output a sensing driving signal, and the sensing driving signal may be used to drive sensing transistors of the certain row of sub-pixel units of the display panel to complete external compensation for the row of sub-pixel units.

The second input/output unit 320 is configured to output a composite output signal to the second output terminal OP2 under control of a level of the second pull-up node Q<N+1>. For example, in the display period of the frame, the second input/output unit 320 may output a scanning driving signal, and the scanning driving signal may drive another row of sub-pixel units of the display panel to perform scanning display. As another example, in the blanking period of the frame, the second input/output unit 320 may output a sensing driving signal, and the sensing driving signal may be used to drive sensing transistors of the another row of sub-pixel units of the display panel to complete external compensation for the another row of sub-pixel units.

For example, the first input/output unit 310 is of the structure as shown in (a) of FIG. 2, and the second input/output unit 320 is of the structure as shown in (b) of FIG. 2.

The first input/output unit 310 further includes a first pull-down node QB_A<N>, a first output circuit 301, a first pull-down control circuit 401, a first pull-down circuit 501, a first display reset circuit 601 and a first global reset circuit 701. The first output circuit 301 is coupled to at least one clock signal terminal, and is configured to output a first composite output signal to the first output terminal OP1 under the control of the level of the first pull-up node Q<N>.

The first pull-down control circuit 401 is coupled to a first voltage terminal VDD_A and the second voltage terminal VGL1. The first pull-down control circuit 401 is configured to control a level of the first pull-down node QB_A<N> under control of both the level of the first pull-up node Q<N> and the first voltage terminal VDD_A.

The first pull-down circuit 501 is coupled to the second voltage terminal VGL1 and a fourth voltage terminal VGL2. The first pull-down circuit 501 is configured to pull down levels of the first pull-up node Q<N> and the first output terminal OP1 under control of the level of the first pull-down node QB_A<N> to reset the first pull-up node Q<N> and the first output terminal OP1.

The first display reset circuit 601 is coupled to a display reset signal terminal CR<N+8> and the second voltage terminal VGL1. The first display reset circuit 601 is configured to reset the first pull-up node Q<N> in response to a display reset signal.

The first global reset circuit 701 is coupled to a global reset signal terminal TRST and the second voltage terminal VGL1. The first global reset circuit 701 is configured to reset the first pull-up node Q<N> in response to a global reset signal.

The second input/output unit 320 further includes a second pull-down node QB_B<N>, a second output circuit 302, a second pull-down control circuit 402, a second pull-down circuit 502, a second display reset circuit 602 and a second global reset circuit 702. The second output circuit 302 is coupled to at least one clock signal terminal, and is configured to output a second composite output signal to the second output terminal OP2 under the control of the level of the second pull-up node Q<N+1>.

The second pull-down control circuit 402 is coupled to the third voltage terminal VDD_B and the second voltage terminal VGL1. The second pull-down control circuit 402 is configured to control a level of the second pull-down node QB_B<N> under control of both the level of the second pull-up node Q<N+1> and the third voltage terminal VDD_B.

The second pull-down circuit 502 is coupled to the second voltage terminal VGL1 and the fourth voltage terminal VGL2. The second pull-down circuit 502 is configured to pull down levels of the second pull-up node Q<N+1> and the second output terminal OP2 under control of the level of the second pull-down node QB_B<N> to reset the second pull-up node Q<N+1> and the second output terminal OP2. The second display reset circuit 602 is coupled to the display reset signal terminal CR<N+8> and the second voltage terminal VGL1. The second display reset circuit 602 is configured to reset the second pull-up node Q<N+1> in response to the display reset signal. The second global reset circuit 702 is coupled to the global reset signal terminal TRST and the second voltage terminal VGL1. The second global reset circuit 702 is configured to reset the second pull-up node Q<N+1> in response to the global reset signal.

It will be noted that, in the embodiments of the present disclosure, the second voltage terminal VGL1 may receive a same low-level signal as the fourth voltage terminal VGL2. That is, the two voltage terminals may be coupled to a same signal line to receive the same low-level signal. Alternatively, the two voltage terminals may be coupled to different signal lines, so as to receive different low-level signals, which is not limited in the embodiments of the present disclosure. In addition, the term "blanking" in the blanking input circuit 100 only means that the blanking input circuit 100 is related to the blanking period, and does not limit the blanking input circuit 100 to work only in the blanking period.

However, one of the first voltage terminal VDD_A and the third voltage terminal VDD_B is always at a high level, and the high level controls the first pull-down node QB_A<N> or the second pull-down node QB_B<N> to be at a high level, which causes the first pull-down circuit 501 to be turned on to perform a noise reduction for the first pull-up node Q<N>, or causes the second pull-down circuit 502 to be turned on to perform a noise reduction for the second pull-up node Q<N+1>. However, in a case where the display control signal or the blanking control signal is at a high level and is written into the first pull-up node Q<N> and the second pull-up node Q<N+1>, a high-level signal provided by the first voltage terminal VDD_A or the third voltage terminal VDD_B may be easily used as a signal that prevents high-level signals from being written into the first pull-up node Q<N> or the second pull-up node Q<N+1>, resulting in current leakage. As a result, the high level written into the first pull-up node Q<N> or the second pull-up node Q<N+1> is pulled down. Therefore, a written capability of the shift register unit 1101, i.e., the gate driving circuit 1100 where the shift register unit 1101 is located, is poor.

Figure 3:
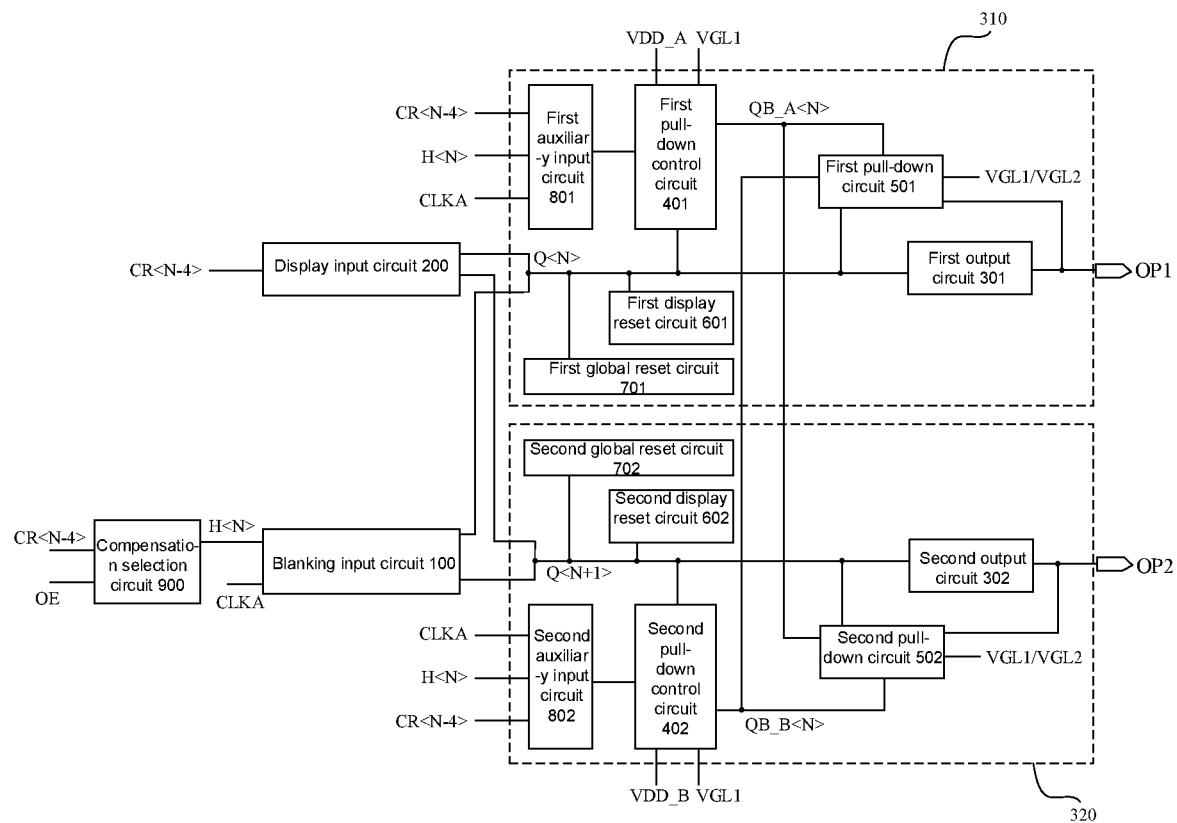
FIG. 3 is a structural diagram of a shift register unit, in accordance with some embodiments of the present disclosure.

In light of this, embodiments of the present disclosure provide a shift register unit 1101. As shown in FIG. 3, in the shift register unit 1101, the first input/output unit 310 further includes a first auxiliary input circuit 801. The second input/output unit 320 further includes a second auxiliary input circuit 802.

The first auxiliary input circuit 801 is coupled to the first pull-down control circuit 401. The first auxiliary input circuit 801 is configured to control the first pull-down control circuit 401 together with a level of a first pull-up node Q<N> in response to a display control signal (e.g., a display control signal provided via a display control signal terminal CR<N−4>), a blanking control signal (e.g., a blanking pull-up control signal provided via a blanking pull-up control node H<N>, and a first clock signal provided via a first clock signal terminal CLKA). The first pull-down control circuit 401 is configured to control a level of the first pull-down node QB_A<N> under control of both the level of the first pull-up node Q<N> and the first auxiliary input circuit 801.

The second auxiliary input circuit 802 is coupled to the second pull-down control circuit 402. The second auxiliary input circuit 802 is configured to control the second pull-down control circuit 402 together with a level of a second pull-up node Q<N+1> in response to the display control signal and the blanking control signal. The second pull-down control circuit 402 is configured to control a level of the second pull-down node QB_B<N> under control of both the level of the second pull-up node Q<N+1> and the second auxiliary input circuit 802.

In the embodiments of the present disclosure, the first auxiliary input circuit 801 and the second auxiliary input circuit 802 are added in the shift register unit.

Thus, in the display input period, the first auxiliary input circuit 801 assists in controlling the first pull-down control circuit 401 in response to the display control signal, so that the level of the first pull-down node QB_A<N> may be pulled down, so as to control the first pull-down circuit 501 to be turned off; and the second auxiliary input circuit 802 assists in controlling the second pull-down control circuit 402 in response to the display control signal, so that the level of the second pull-down node QB_B<N> may be pulled down, so as to control the second pull-down circuit 502 to be turned off.

In the blanking input period, the first auxiliary input circuit 801 assists in controlling the first pull-down control circuit 401 in response to the blanking control signal, so that the level of the first pull-down node QB_A<N> may be pulled down, so as to control the first pull-down circuit 501 to be turned off; and the second auxiliary input circuit 802 assists in controlling the second pull-down control circuit 402 in response to the blanking control signal, so that the level of the second pull-down node QB_B<N> may be pulled down, so as to control the second pull-down circuit 502 to be turned off. In this way, in the display input period and the blanking input period, electric leakage from the first pull-up node Q<N> and the second pull-up node Q<N+1> to the second voltage terminal VGL1 may be effectively prevented. That is, the first pull-down circuit 501 and the second pull-down circuit 502 are turned off due to a high level provided via the first voltage terminal VDD_A or the third voltage terminal VDD_B. Therefore, a problem of abnormally high-level writing caused by leakage of the first pull-up node Q<N> and the second pull-up node Q<N+1> is avoided, which effectively improves the written capability of the shift register unit, and thus, serviceability of the gate driving circuit and the display device may be improved.

Structures of the first pull-down control circuit 401 and the second pull-down control circuit 402 may be set according to actual needs.

Figure 4:
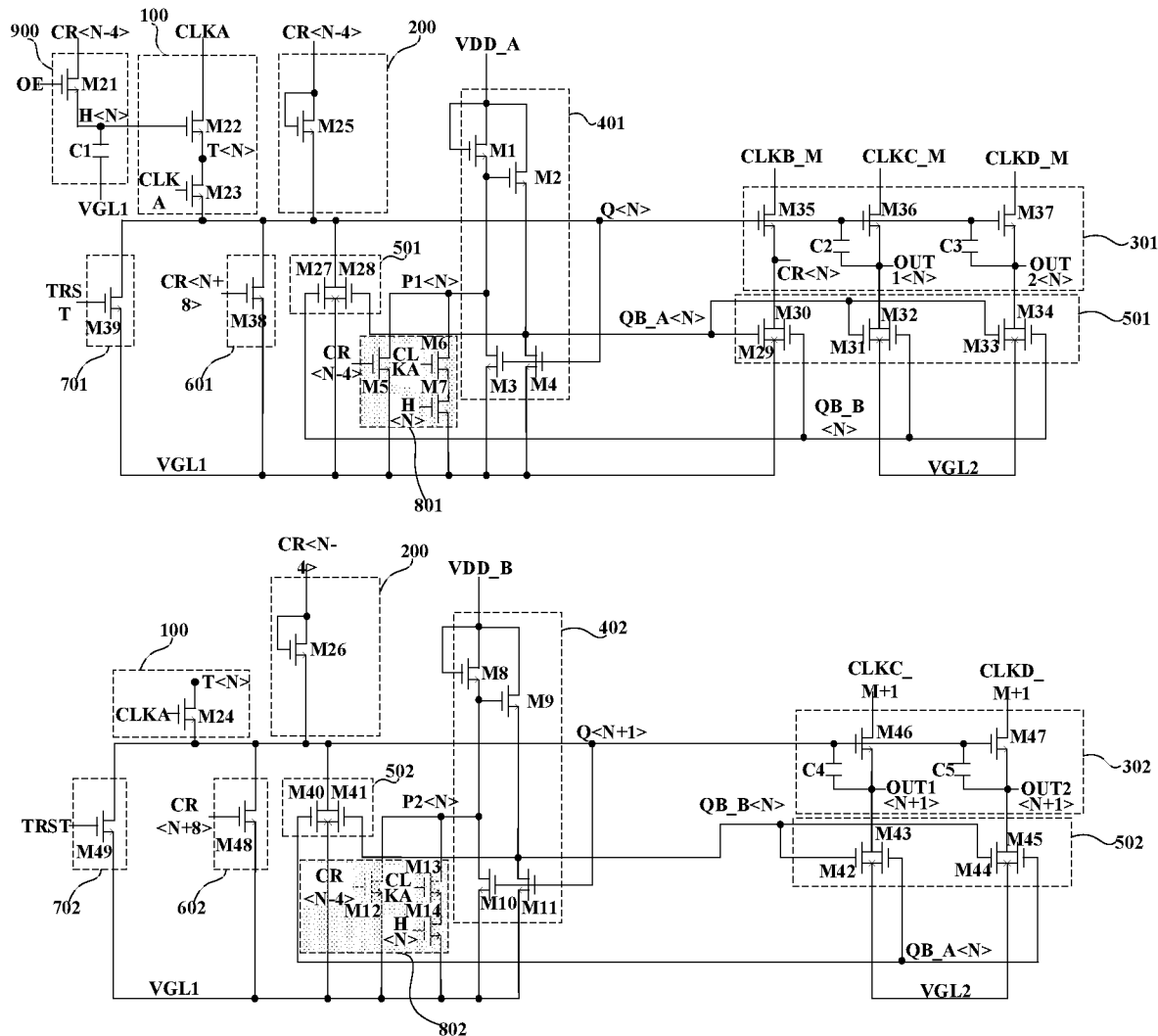
FIG. 4 is a configuration diagram of another shift register unit, in accordance with some embodiments of the present disclosure.
Figure 5:
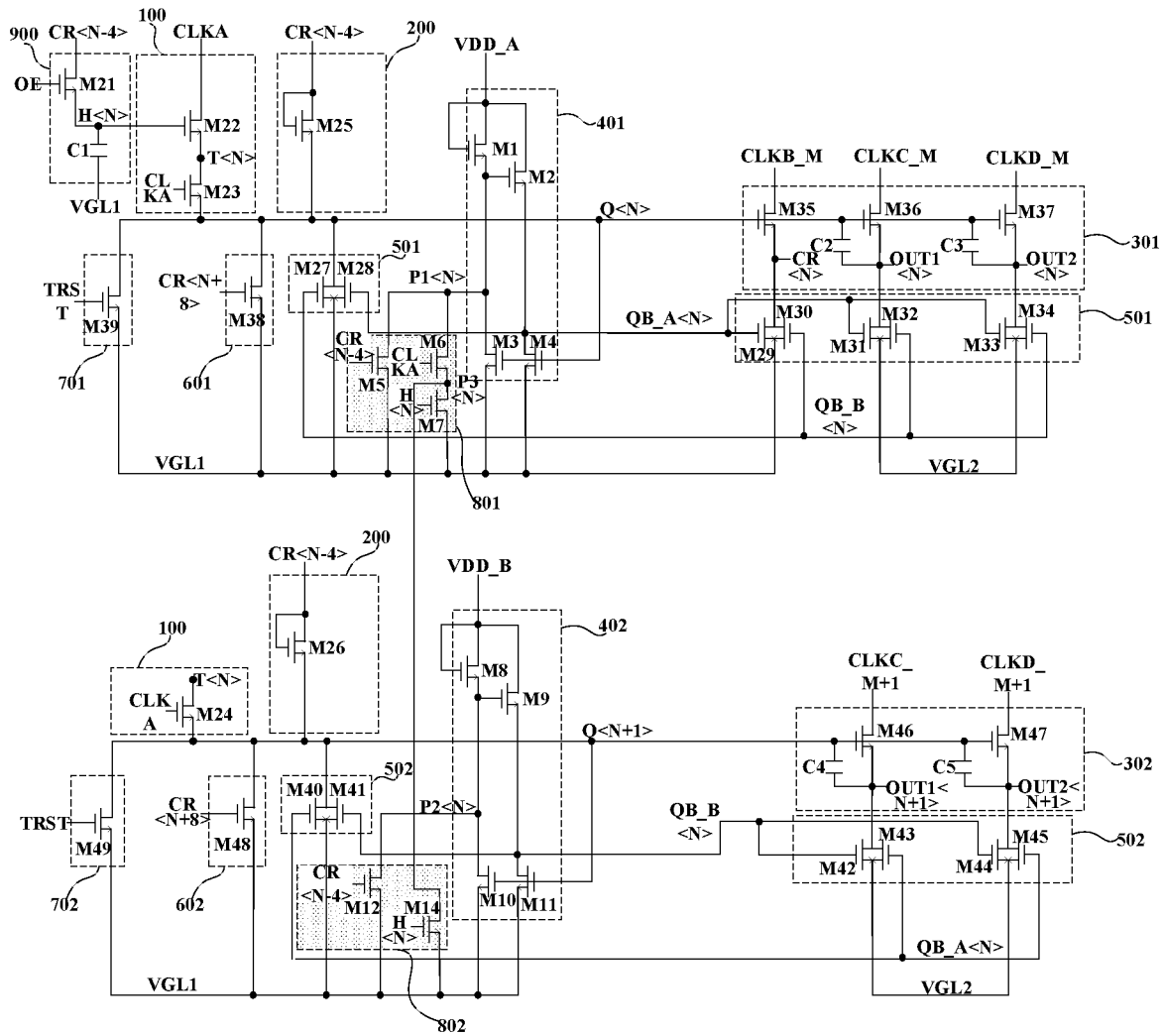
FIG. 5 is a configuration diagram of yet another shift register unit, in accordance with some embodiments of the present disclosure.

In some embodiments, as shown in FIGS. 4 and 5, the first pull-down control circuit 401 includes a first transistor M1, a second transistor M2, a third transistor M3 and a fourth transistor M4. A control electrode of the first transistor M1 is coupled to the first voltage terminal VDD_A, a first electrode of the first transistor M1 is coupled to the first voltage terminal VDD_A, and a second electrode of the first transistor M1 is coupled to a first auxiliary node P1<N> and a control electrode of the second transistor M2. A first electrode of the second transistor M2 is coupled to the first voltage terminal VDD_A, and a second electrode of the second transistor M2 is coupled to the first pull-down node QB_A<N>. A control electrode of the third transistor M3 is coupled to the first pull-up node Q<N>, a first electrode of the third transistor M3 is coupled to the first auxiliary node P1<N>, and a second electrode of the third transistor M3 is coupled to the second voltage terminal VGL1. A control electrode of the fourth transistor M4 is coupled to the first pull-up node Q<N>, a first electrode of the fourth transistor M4 is coupled to the first pull-down node QB_A<N>, and a second electrode of the fourth transistor M4 is coupled to the second voltage terminal VGL1.

The second pull-down control circuit 402 includes an eighth transistor M8, a ninth transistor M9, a tenth transistor M10 and an eleventh transistor M11. A control electrode of the eighth transistor M8 is coupled to the third voltage terminal VDD_B, a first electrode of the eighth transistor M8 is coupled to the third voltage terminal VDD_B, and a second electrode of the eighth transistor M8 is coupled to a second auxiliary node P2<N> and a control electrode of the ninth transistor M9. A first electrode of the ninth transistor M9 is to coupled to the third voltage terminal VDD_B, and a second electrode of the ninth transistor M9 is coupled to the second pull-down node QB_B<N>. A control electrode of the tenth transistor M10 is coupled to the second pull-up node Q<N+1>, a first electrode of the tenth transistor M10 is coupled to the second auxiliary node P2<N>, and a second electrode of the tenth transistor M10 is coupled to the second voltage terminal VGL1. A control electrode of the eleventh transistor M11 is coupled to the second pull-up node Q<N+1>, a first electrode of the eleventh transistor M11 is coupled to the second pull-down node QB_B<N>, and a second electrode of the eleventh transistor M11 is coupled to the second voltage terminal VGL1.

The first auxiliary input circuit 801 is coupled to the first pull-down control circuit 401 to assist in controlling the first pull-down control circuit 401. The second auxiliary input circuit 802 is coupled to the second pull-down control circuit 402 to assist in controlling the second pull-down control circuit 402. Structures of the first auxiliary input circuit 801 and the second auxiliary input circuit 802 are related to the structures of the first pull-down control circuit 401 and the second pull-down control circuit 402, respectively, and may be set according to actual needs.

In some embodiments, as shown in FIG. 4, the first auxiliary input circuit 801 includes a fifth transistor M5, a sixth transistor M6 and a seventh transistor M7. A control electrode of the fifth transistor M5 is coupled to the display control signal terminal CR<N−4>, a first electrode of the fifth transistor M5 is coupled to the first auxiliary node P1<N>, and a second electrode of the fifth transistor M5 is coupled to the second voltage terminal VGL1. A control electrode of the sixth transistor M6 is coupled to the first clock signal terminal CLKA, a first electrode of the sixth transistor M6 is coupled to the first auxiliary node P1<N>, and a second electrode of the sixth transistor M6 is coupled to a first electrode of the seventh transistor M7. A control electrode of the seventh transistor M7 is coupled to the blanking pull-up control node H<N>, and a second electrode of the seventh transistor M7 is coupled to the second voltage terminal VGL1.

With continued reference to FIG. 4, the second auxiliary input circuit 802 includes a twelfth transistor M12, a thirteenth transistor M13 and a fourteenth transistor M14. A control electrode of the twelfth transistor M12 is coupled to the display control signal terminal CR<N−4>, a first electrode of the twelfth transistor M12 is coupled to the second auxiliary node P2<N>, and a second electrode of the twelfth transistor M12 is coupled to the second voltage terminal VGL1. A control electrode of the thirteenth transistor M13 is coupled to the first clock signal terminal CLKA, a first electrode of the thirteenth transistor M13 is coupled to the second auxiliary node P2<N>, and a second electrode of the thirteenth transistor M13 is coupled to a first electrode of the fourteenth transistor M14. A control electrode of the fourteenth transistor M14 is coupled to the blanking pull-up control node H<N>, and a second electrode of the fourteenth transistor M14 is coupled to the second voltage terminal VGL1.

In some other embodiments, as shown in FIG. 5, the first auxiliary input circuit 801 includes a fifth transistor M5, a sixth transistor M6 and a seventh transistor M7. A control electrode of the fifth transistor M5 is coupled to the display control signal terminal CR<N−4>, a first electrode of the fifth transistor M5 is coupled to the first auxiliary node P1<N>, and a second electrode of the fifth transistor M5 is coupled to the second voltage terminal VGL1. A control electrode of the sixth transistor M6 is coupled to the first clock signal terminal CLKA, a first electrode of the sixth transistor M6 is coupled to the first auxiliary node P1<N>, and a second electrode of the sixth transistor M6 is coupled to a third auxiliary node P3<N>. A control electrode of the seventh transistor M7 is coupled to the blanking pull-up control node H<N>, a first electrode of the seventh transistor M7 is coupled to the third auxiliary node P3<N>, and a second electrode of the seventh transistor M7 is coupled to the second voltage terminal VGL1.

As shown in FIG. 5, the second auxiliary input circuit 802 includes a twelfth transistor M12 and a fourteenth transistor M14. A control electrode of the twelfth transistor M12 is coupled to the display control signal terminal CR<N−4>, a first electrode of the twelfth transistor M12 is coupled to the second auxiliary node P2<N>, and a second electrode of the twelfth transistor M12 is coupled to the second voltage terminal VGL1. A control electrode of the fourteenth transistor M14 is coupled to the blanking pull-up control node H<N>, a first electrode of the fourteenth transistor M14 is coupled to the third auxiliary node P3<N>, and a second electrode of the fourteenth transistor M14 is coupled to the second voltage terminal VGL1.

Only two kinds of structures of the first auxiliary input circuit 801 and the second auxiliary input circuit 802 are schematically illustrated above, but the structures are certainly not limited thereto.

Figure 6:
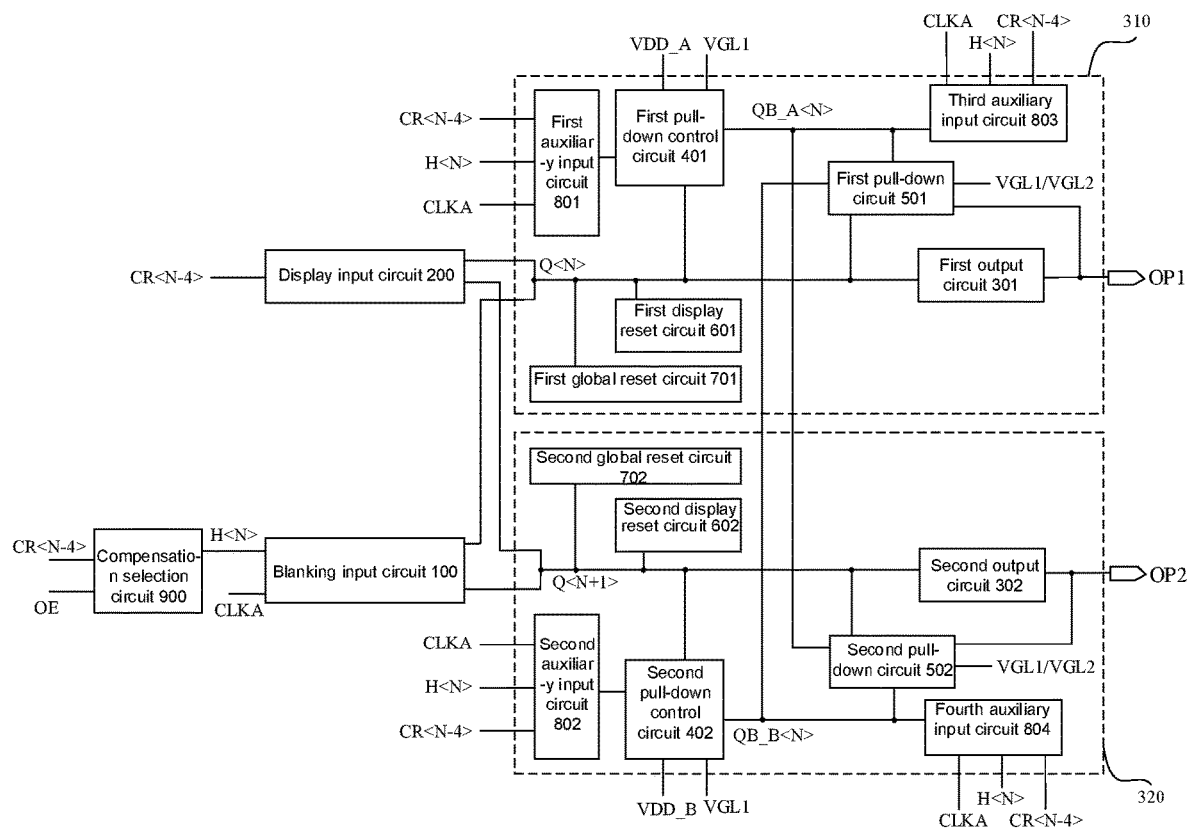
FIG. 6 is a structural diagram of yet another shift register unit, in accordance with some embodiments of the present disclosure.
Figure 7:
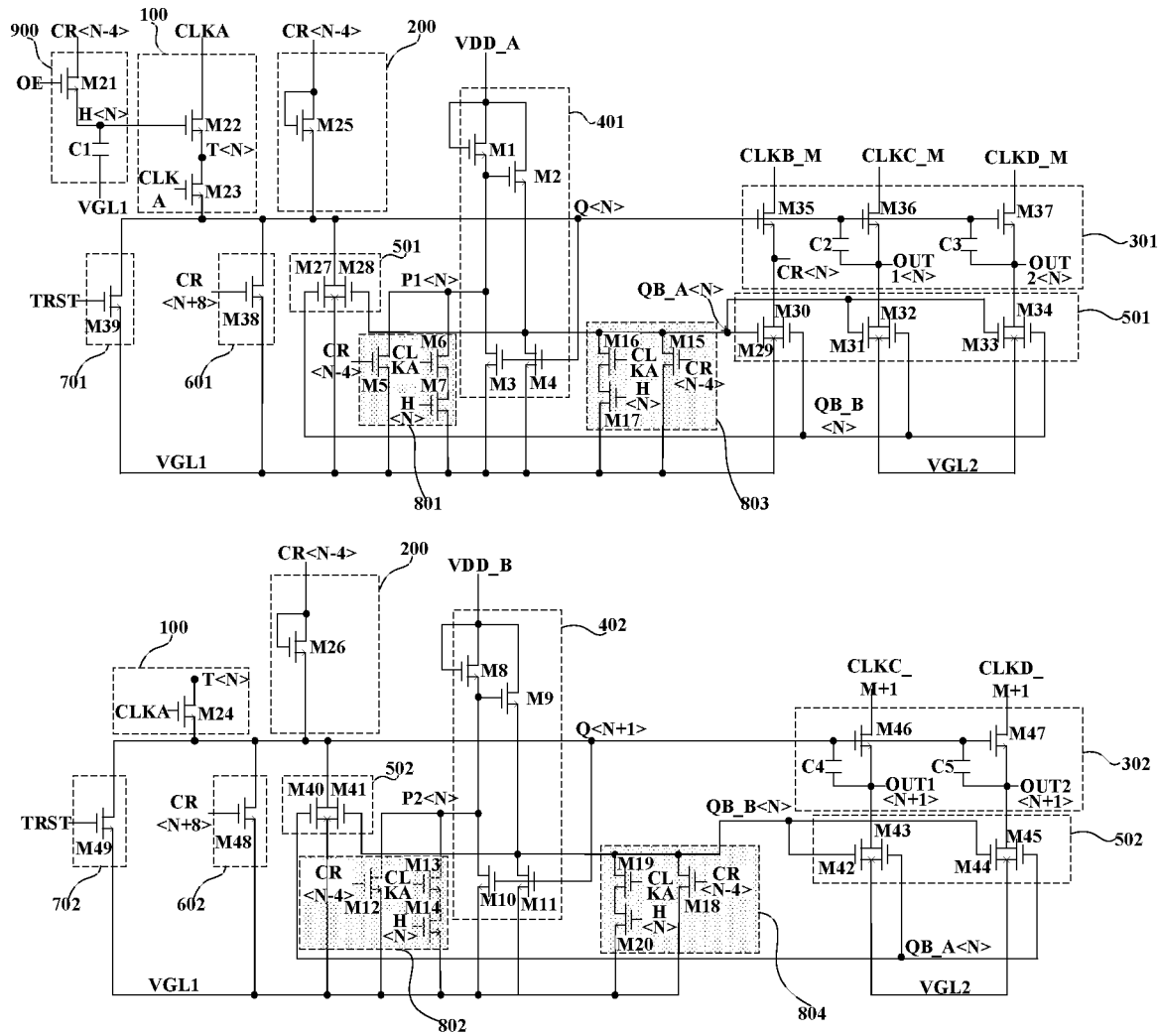
FIG. 7 is a configuration diagram of yet another shift register unit, in accordance with some embodiments of the present disclosure.
Figure 8:
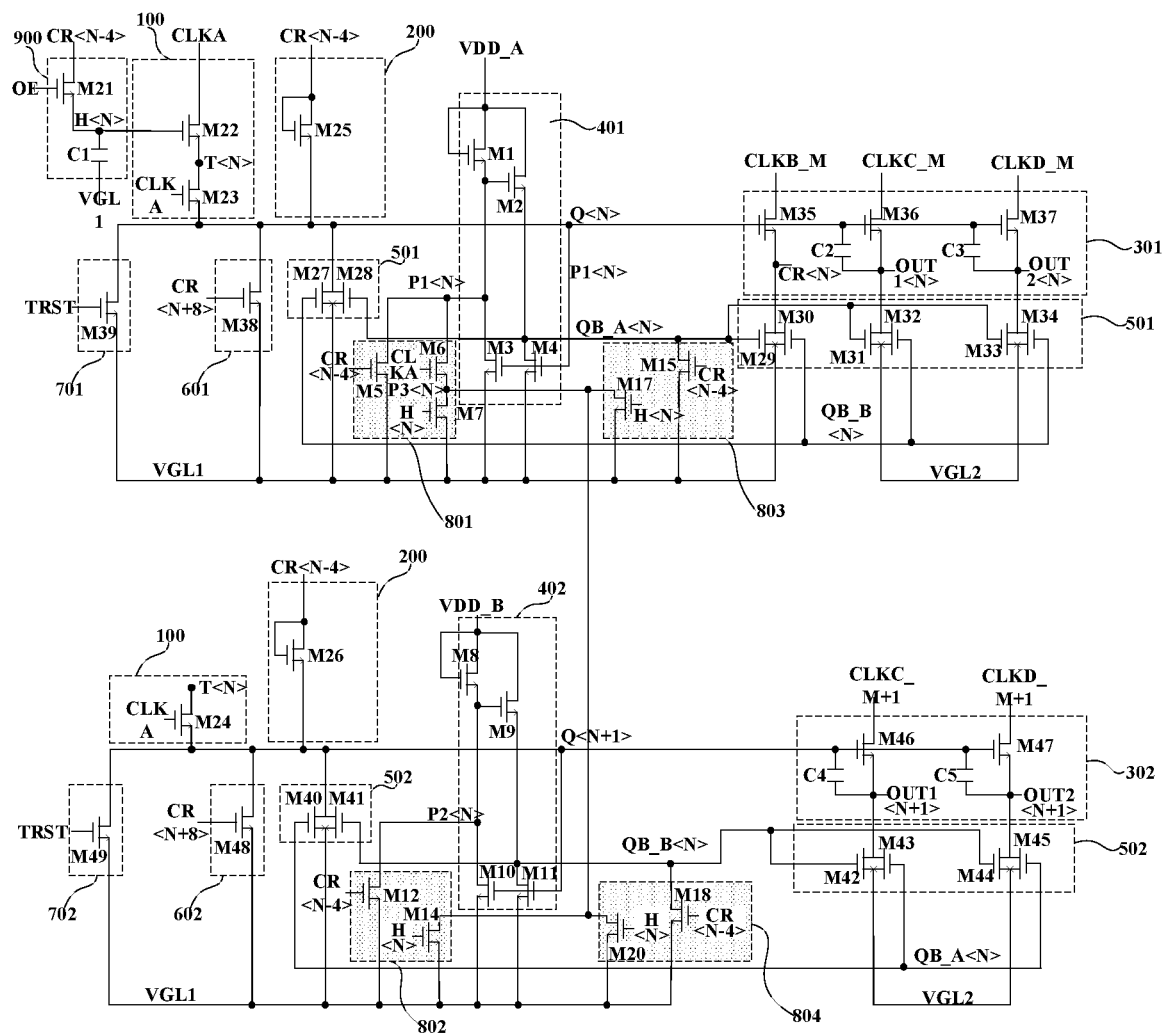
FIG. 8 is a configuration diagram of yet another shift register unit, in accordance with some embodiments of the present disclosure.

In some embodiments, referring to FIGS. 6, 7 and 8, the first input/output unit 310 further includes a third auxiliary input circuit 803, and the second input/output unit 320 further includes a fourth auxiliary input circuit 804. The third auxiliary input circuit 803 is coupled to the first pull-down node QB_A<N>. The third auxiliary input circuit 803 is configured to control the level of the first pull-down node QB_A<N> in response to the display control signal and the blanking control signal. The fourth auxiliary input circuit 804 is coupled to the second pull-down node QB_B<N>. The fourth auxiliary input circuit 804 is configured to control the level of the second pull-down node QB_B<N> in response to the display control signal and the blanking control signal.

In this way, in the display input period, the third auxiliary input circuit 803 may directly pull down the level of the first pull-down node QB_A<N> in response to the display control signal, so as to control the first pull-down circuit 501 to be turned off; and the fourth auxiliary input circuit 804 may directly pull down the level of the second pull-down node QB_B<N> in response to the display control signal, so as to control the second pull-down circuit 502 to be turned off. In the blanking input period, the third auxiliary input circuit 803 may directly pull down the level of the first pull-down node QB_A<N> in response to the blanking control signal, so as to control the first pull-down circuit 501 to be turned off; and the fourth auxiliary input circuit 804 may directly pull down the level of the second pull-down node QB_B<N> in response to the blanking control signal, so as to control the second pull-down circuit 502 to be turned off. Thus, in the display input period and the blanking input period, it can further ensure that the electric leakage, caused by the constant high-level signal provided via the first voltage terminal VDD_A or the third voltage terminal VDD_B, from the first pull-up node Q<N> and the second pull-up node Q<N+1> to the second voltage terminal VGL1 is effectively prevented. Therefore, the problem of abnormally high-level writing caused by the leakage of the first pull-up node Q<N> and the second pull-up node Q<N+1> is avoided, which effectively improves the written capability of the shift register unit.

For example, as shown in FIG. 7, the third auxiliary input circuit 803 includes a fifteenth transistor M15, a sixteenth transistor M16 and a seventeenth transistor M17. A control electrode of the fifteenth transistor M15 is coupled to the display control signal terminal CR<N−4>, a first electrode of the fifteenth transistor M15 is coupled to the first pull-down node QB_A<N>, and a second electrode of the fifteenth transistor M15 is coupled to the second voltage terminal VGL1. A control electrode of the sixteenth transistor M16 is coupled to the first clock signal terminal CLKA, a first electrode of the sixteenth transistor M16 is coupled to the first pull-down node QB_A<N>, and a second electrode of the sixteenth transistor M16 is coupled to a first electrode of the seventeenth transistor M17. A control electrode of the seventeenth transistor M17 is coupled to the blanking pull-up control node H<N>, and a second electrode of the seventeenth transistor M17 is coupled to the second voltage terminal VGL1.

The fourth auxiliary input circuit 804 includes an eighteenth transistor M18, a nineteenth transistor M19 and a twentieth transistor M20. A control electrode of the eighteenth transistor M18 is coupled to the display control signal terminal CR<N−4>, a first electrode of the eighteenth transistor M18 is coupled to the second pull-down node QB_B<N>, and a second electrode of the eighteenth transistor M18 is coupled to the second voltage terminal VGL1. A control electrode of the nineteenth transistor M19 is coupled to the first clock signal terminal CLKA, a first electrode of the nineteenth transistor M19 is coupled to the second pull-down node QB_B<N>, and a second electrode of the nineteenth transistor M19 is coupled to a first electrode of the twentieth transistor M20. A control electrode of the twentieth transistor M20 is coupled to the blanking pull-up control node H<N>, and a second electrode of the twentieth transistor M20 is coupled to the second voltage terminal VGL1.

For example, as shown in FIG. 8, in a case where the first auxiliary input circuit 801 is coupled to the third auxiliary node P3<N>, the third auxiliary input circuit 803 includes a fifteenth transistor M15 and a seventeenth transistor M17. A control electrode of the fifteenth transistor M15 is coupled to the display control signal terminal CR<N−4>, a first electrode of the fifteenth transistor M15 is coupled to the first pull-down node QB_A<N>, and a second electrode of the fifteenth transistor M15 is coupled to the second voltage terminal VGL1. A control electrode of the seventeenth transistor M17 is coupled to the blanking pull-up control node H<N>, a first electrode of the seventeenth transistor M17 is coupled to the third auxiliary node P3<N>, and a second electrode of the seventeenth transistor M17 is coupled to the second voltage terminal VGL1.

The fourth auxiliary input circuit 804 includes an eighteenth transistor M18 and a twentieth transistor M20. A control electrode of the eighteenth transistor M18 is coupled to the display control signal terminal CR<N−4>, a first electrode of the eighteenth transistor M18 is coupled to the second pull-down node QB_B<N>, and a second electrode of the eighteenth transistor M18 is coupled to the second voltage terminal VGL1. A control electrode of the twentieth transistor M20 is coupled to the blanking pull-up control node H<N>, a first electrode of the twentieth transistor M20 is coupled to the third auxiliary node P3<N>, and a second electrode of the twentieth transistor M20 is coupled to the second voltage terminal VGL1.

In the shift register unit 1101 provided in the embodiments of the present disclosure, structures of the first pull-down circuit 501, the second pull-down circuit 502, a first output circuit 301, a second output circuit 302, a first display reset circuit 601, a first global reset circuit 701, a second display reset circuit 602 and a second global reset circuit 702 may be set according to actual needs.

For example, referring to FIGS. 4, 5, 7 and 8, the first output circuit 301 includes a thirty-fifth transistor M35, a thirty-sixth transistor M36, a thirty-seventh transistor M37, a second capacitor C2 and a third capacitor C3. The first pull-down circuit 501 includes a twenty-seventh transistor M27, a twenty-eighth transistor M28, a twenty-ninth transistor M29, a thirtieth transistor M30, a thirty-first transistor M31, a thirty-second transistor M32, a thirty-third transistor M33 and a thirty-fourth transistor M34.

In the first output circuit 301, a control electrode of the thirty-fifth transistor M35 is coupled to the first pull-up node Q<N>, a first electrode of the thirty-fifth transistor M35 is coupled to a second clock signal terminal CLKB_M, and a second electrode of the thirty-fifth transistor M35 is coupled to a shift signal output terminal CR<N>. A control electrode of the thirty-sixth transistor M36 is coupled to the first pull-up node Q<N>, a first electrode of the thirty-sixth transistor M36 is coupled to a third clock signal terminal CLKC_M, and a second electrode of the thirty-sixth transistor M36 is coupled to a first pixel scanning signal output terminal OUT1<N>. A control electrode of the thirty-seventh transistor M37 is coupled to the first pull-up node Q<N>, a first electrode of the thirty-seventh transistor M37 is coupled to a fourth clock signal terminal CLKD_M, and a second electrode of the thirty-seventh transistor M37 is coupled to a second pixel scanning signal output terminal OUT2<N>. A first electrode of the second capacitor C2 is coupled to the control electrode of the thirty-sixth transistor M36, and a second electrode of the second capacitor C2 is coupled to the first pixel scanning signal output terminal OUT1<N>. A first electrode of the third capacitor C3 is coupled to the control electrode of the thirty-seventh transistor M37, and a second electrode of the third capacitor C3 is coupled to the second pixel scanning signal output terminal OUT2<N>.

In the first pull-down circuit 501, a control electrode of the twenty-seventh transistor M27 is coupled to the second pull-down node QB_B<N>, a first electrode of the twenty-seventh transistor M27 is coupled to the first pull-up node Q<N>, and a second electrode of the twenty-seventh transistor M27 is coupled to the second voltage terminal VGL1. A control electrode of the twenty-eighth transistor M28 is coupled to the first pull-down node QB_A<N>, a first electrode of the twenty-eighth transistor M28 is coupled to the first pull-up node Q<N>, and a second electrode of the twenty-eighth transistor M28 is coupled to the second voltage terminal VGL1. A control electrode of the twenty-ninth transistor M29 is coupled to the first pull-down node QB_A<N>, a first electrode of the twenty-ninth transistor M29 is coupled to the shift signal output terminal CR<N>, and a second electrode of the twenty-ninth transistor M29 is coupled to the second voltage terminal VGL1. A control electrode of the thirtieth transistor M30 is coupled to the second pull-down node QB_B<N>, a first electrode of the thirtieth transistor M30 is coupled to the shift signal output terminal CR<N>, and a second electrode of the thirtieth transistor M30 is coupled to the second voltage terminal VGL1. A control electrode of the thirty-first transistor M31 is coupled to the first pull-down node QB_A<N>, a first electrode of the thirty-first transistor M31 is coupled to the first pixel scanning signal output terminal OUT1<N>, and a second electrode of the thirty-first transistor M31 is coupled to a fourth voltage terminal VGL2. A control electrode of the thirty-second transistor M32 is coupled to the second pull-down node QB_B<N>, a first electrode of the thirty-second transistor M32 is coupled to the first pixel scanning signal output terminal OUT1<N>, and a second electrode of the thirty-second transistor M32 is coupled to the fourth voltage terminal VGL2. A control electrode of the thirty-third transistor M33 is coupled to the first pull-down node QB_A<N>, a first electrode of the thirty-third transistor M33 is coupled to the second pixel scanning signal output terminal OUT2<N>, and a second electrode of the thirty-third transistor M33 is coupled to the fourth voltage terminal VGL2. A control electrode of the thirty-fourth transistor M34 is coupled to the second pull-down node QB_B<N>, a first electrode of the thirty-fourth transistor M34 is coupled to the second pixel scanning signal output terminal OUT2<N>, and a second electrode of the thirty-fourth transistor M34 is coupled to the fourth voltage terminal VGL2.

With continued reference to FIGS. 4, 5, 7 and 8, the second output circuit 302 includes a forty-sixth transistor M46, a forty-seventh transistor M47, a fourth capacitor C4 and a fifth capacitor C5. The second pull-down circuit 502 includes a fortieth transistor M40, a forty-first transistor M41, a forty-second transistor M42, a forty-third transistor M43, a forty-fourth transistor M44 and a forty-fifth transistor M45.

In the second output circuit 302, a control electrode of the forty-sixth transistor M46 is coupled to the second pull-up node Q<N+1>, a first electrode of the forty-sixth transistor M46 is coupled to a fifth clock signal terminal CLKC_M+1, and a second electrode of the forty-sixth transistor M46 is coupled to a third pixel scanning signal output terminal OUT1<N+1>. A control electrode of the forty-seventh transistor M47 is coupled to the second pull-up node Q<N+1>, a first electrode of the forty-seventh transistor M47 is coupled to a sixth clock signal terminal CLKD_M+1, and a second electrode of the forty-seventh transistor M47 is coupled to a fourth pixel scanning signal output terminal OUT2<N+1>. A first electrode of the fourth capacitor C4 is coupled to the control electrode of the forty-sixth transistor M46, and a second electrode of the fourth capacitor C4 is coupled to the third pixel scanning signal output terminal OUT1<N+1>. A first electrode of the fifth capacitor C5 is coupled to the control electrode of the forty-seventh transistor M47, and a second electrode of the fifth capacitor C5 is coupled to the fourth pixel scanning signal output terminal OUT2<N+1>. The first electrode of the fourth capacitor C4, the control electrode of the forty-sixth transistor M46, the first electrode of the fifth capacitor C5 and the control electrode of the forty-seventh transistor M47 are all coupled to the second pull-up node Q<N+1>.

In the second pull-down circuit 502, a control electrode of the fortieth transistor M40 is coupled to the first pull-down node QB_A<N>, a first electrode of the fortieth transistor M40 is coupled to the second pull-up node Q<N+1>, and a second electrode of the fortieth transistor M40 is coupled to the second voltage terminal VGL1. A control electrode of the forty-first transistor M41 is coupled to the second pull-down node QB_B<N>, a first electrode of the forty-first transistor M41 is coupled to the second pull-up node Q<N+1>, and a second electrode of the forty-first transistor M41 is coupled to the second voltage terminal VGL1. A control electrode of the forty-second transistor M42 is coupled to the second pull-down node QB_B<N>, a first electrode of the forty-second transistor M42 is coupled to the third pixel scanning signal output terminal OUT1<N+1>, and a second electrode of the forty-second transistor M42 is coupled to the fourth voltage terminal VGL2. A control electrode of the forty-third transistor M43 is coupled to the first pull-down node QB_A<N>, a first electrode of the forty-third transistor M43 is coupled to the third pixel scanning signal output terminal OUT1<N+1>, and a second electrode of the forty-third transistor M43 is coupled to the fourth voltage terminal VGL2. A control electrode of the forty-fourth transistor M44 is coupled to the second pull-down node QB_B<N>, a first electrode of the forty-fourth transistor M44 is coupled to the fourth pixel scanning signal output terminal OUT2<N+1>, and a second electrode of the forty-fourth transistor M44 is coupled to the fourth voltage terminal VGL2. A control electrode of the forty-fifth transistor M45 is coupled to the first pull-down node QB_A<N>, a first electrode of the forty-fifth transistor M45 is coupled to the fourth pixel scanning signal output terminal OUT2<N+1>, and a second electrode of the forty-fifth transistor M45 is coupled to the fourth voltage terminal VGL2.

With continued reference to FIGS. 4, 5, 7 and 8, the first display reset circuit 601 includes a thirty-eighth transistor M38. A control electrode of the thirty-eighth transistor M38 is coupled to a display reset signal terminal CR<N+8>, a first electrode of the thirty-eighth transistor M38 is coupled to the first pull-up node Q<N>, and a second electrode of the thirty-eighth transistor M38 is coupled to the second voltage terminal VGL1.

The first global reset circuit 701 includes a thirty-ninth transistor M39. A control electrode of the thirty-ninth transistor M39 is coupled to a global reset signal terminal TRST, a first electrode of the thirty-ninth transistor M39 is coupled to the first pull-up node Q<N>, and a second electrode of the thirty-ninth transistor M39 is coupled to the second voltage terminal VGL1.

The second display reset circuit 602 includes a forty-eighth transistor M48. A control electrode of the forty-eighth transistor M48 is coupled to the display reset signal terminal CR<N+8>, a first electrode of the forty-eighth transistor M48 is coupled to the second pull-up node Q<N+1>, and a second electrode of the forty-eighth transistor M48 is coupled to the second voltage terminal VGL1.

The second global reset circuit 702 includes a forty-ninth transistor M49. A control electrode of the forty-ninth transistor M49 is coupled to the global reset signal terminal TRST, a first electrode of the forty-ninth transistor M49 is coupled to the second pull-up node Q<N+1>, and a second electrode of the forty-ninth transistor M49 is coupled to the second voltage terminal VGL1.

It will be noted that, structures of circuits of the shift register unit 1101 are described in the above embodiments. However, the above examples or embodiments will not limit the protection scope of the present disclosure. In practical applications, a person skilled in the art may choose to use or not to use one or more of the circuits according to situations, and none of various combinations and modifications based on the circuits depart from the principle of invention of the present disclosure, and details will not be described here.

Based on the above technical solution of the shift register unit 1101, some embodiments of the present disclosure provide a gate driving circuit 1100. The gate driving circuit 1100 includes a plurality of shift register units 1101 as illustrated in some embodiments described above that are cascaded. Beneficial effects that may be achieved by the gate driving circuit 1100 provided in the embodiments of the present disclosure are the same as the beneficial effects that may be achieved by the shift register unit 1101, and details will not be repeated here.

Figure 9:
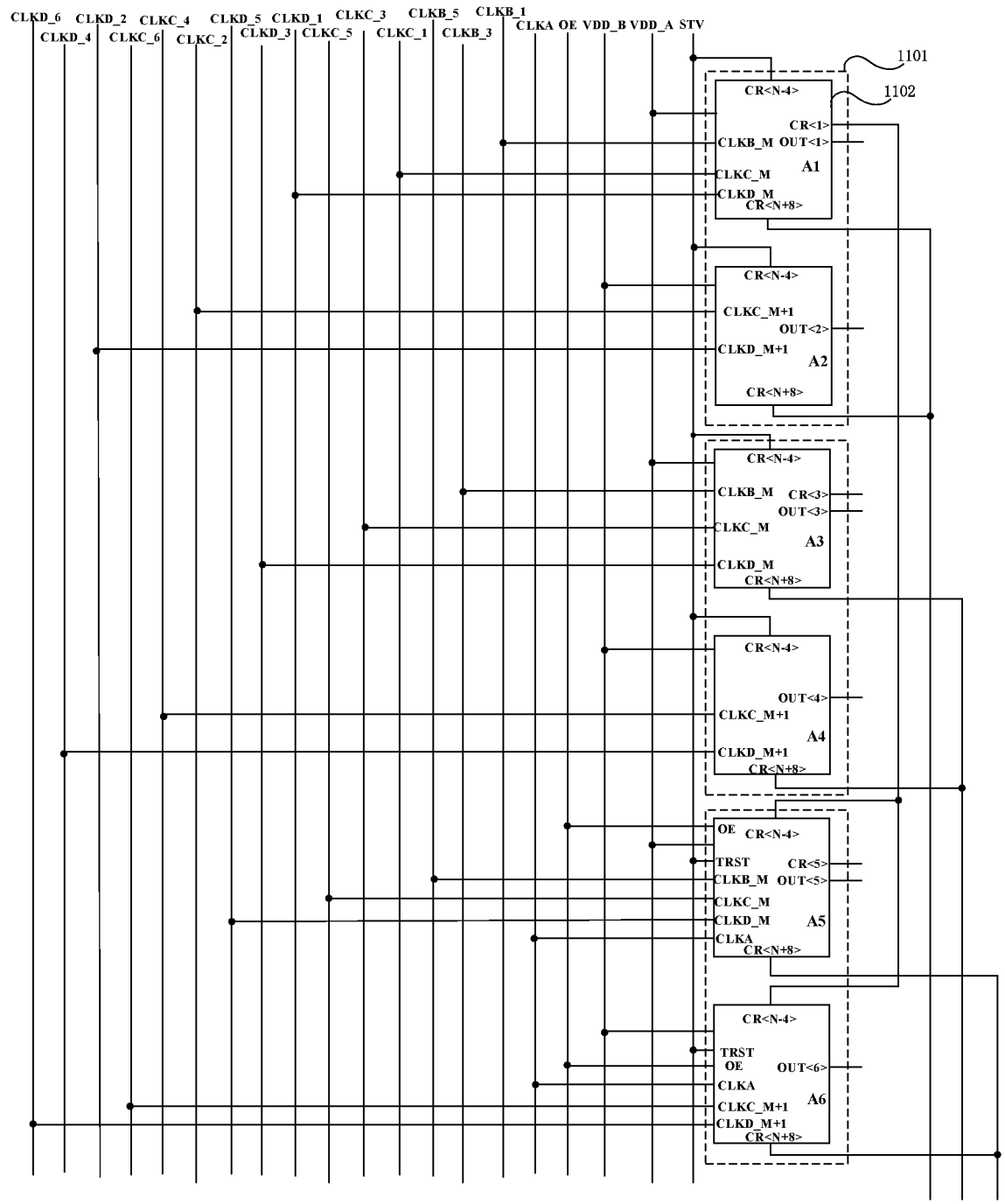
FIG. 9 is a configuration diagram of a gate driving circuit, in accordance with some embodiments of the present disclosure.
Figure 10:
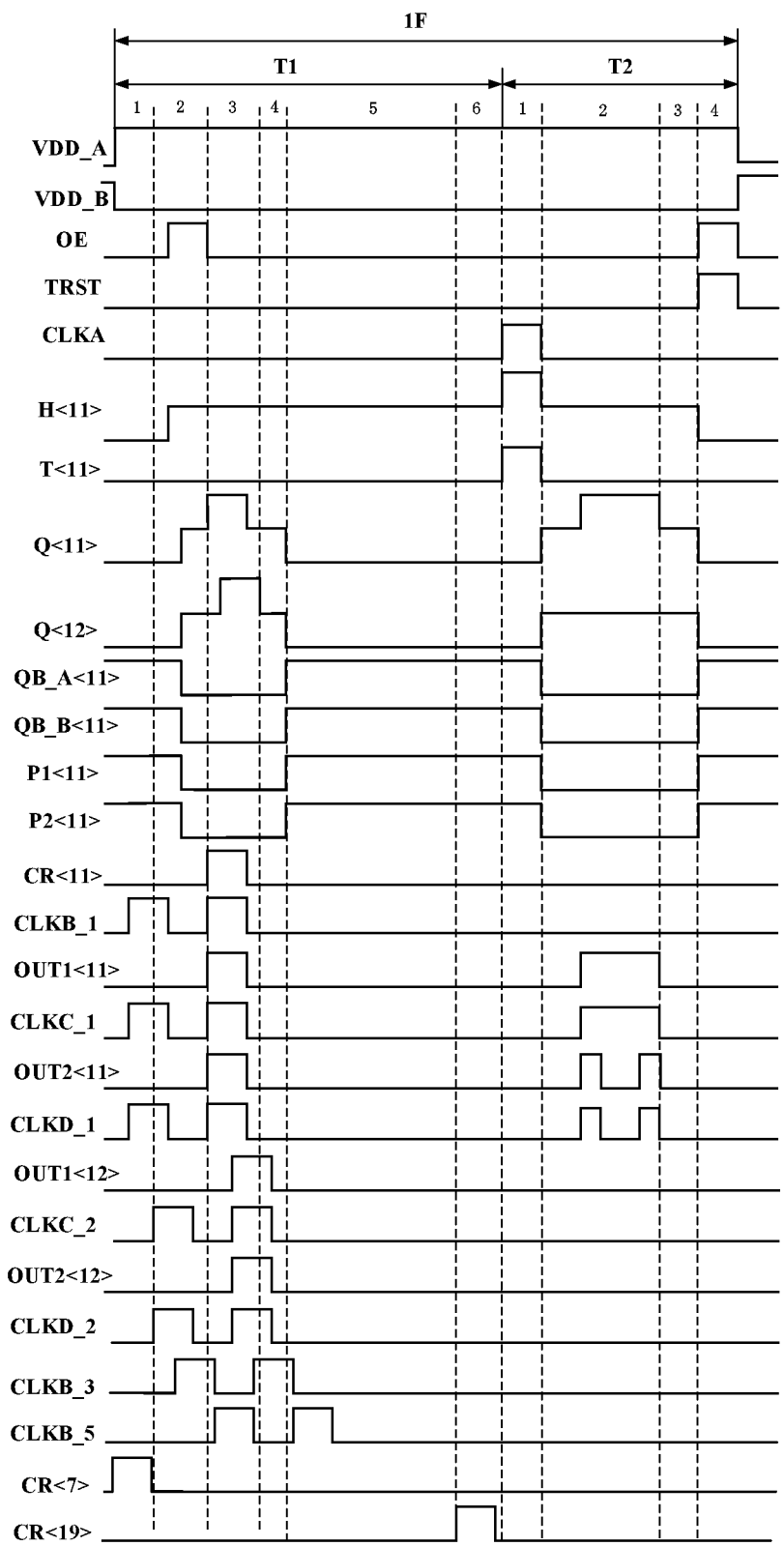
FIG. 10 is a diagram showing a driving timing of a gate driving circuit, in accordance with some embodiments of the present disclosure.

For example, as shown in FIGS. 9 and 10, the gate driving circuit 1100 includes N shift register units 1101 that are cascaded. Each shift register unit 1101 includes two adjacent shift registers 1102. Each shift register 1102 is equivalent to the first input/output unit 310 or the second input/output unit 320 mentioned in the above embodiments of the present disclosure. For example, a first shift register 1102 of the two adjacent shift registers 1102 is a first input/output unit 310, and a second shift register 1102 of the two adjacent shift registers 1102 is a second input/output unit 320. It is only for convenience of description here.

For example, as shown in FIG. 9, considering first six shift registers that are cascaded as an example, a shift register A1 is a first input/output unit 310, and a shift register A2 is a second input/output unit 320; a shift register A3 is another first input/output unit 310, and a shift register A4 is another second input/output unit 320; and a shift register A5 is yet another first input/output unit 310, and a shift register A6 is yet another second input/output unit 320. In this case, the gate driving circuit 1100 includes 2N shift registers 1102 that are cascaded. The shift register unit 1101 is of the structure of the shift register unit provided in the embodiments of the present disclosure or a variation thereof. In the gate driving circuit 1100, for example, first four shift registers 1102 output dummy signals, and the first four shift registers 1102 are each not coupled to any row of sub-pixel units 10. Starting with a fifth shift register 1102, an output terminal of each shift register 1102 is coupled to a respective row of sub-pixel units 10. That is, a first output terminal OP1 and a second output terminal OP2 of each shift register unit 1101 are respectively coupled to two different rows of sub-pixel units 10. For example, in the gate driving circuit in FIG. 9, considering the first six shift registers that are cascaded as an example, the shift register A1 and the shift register A2 together constitute a first shift register unit, the shift register A3 and the shift register A4 together constitute a second shift register unit, and the shift register A5 and the shift register A6 together constitute a third shift register unit.

For example, as shown in FIG. 9, a cascaded manner of the N shift register units 1101 that are cascaded is as follows.

In the first shift register unit 1101, display control signal terminals CR<N−4> of the shift register A1 and the shift register A2 are coupled to a start signal terminal STV (i.e., a start signal line STV).

In the second shift register unit 1101, display control signal terminals CR<N−4> of the shift register A3 and the shift register A4 are coupled to the start signal terminal STV (i.e., the start signal line STV).

In the third shift register unit 1101, display control signal terminals CR<N−4> of the shift register A5 and the shift register A6 are coupled to a shift signal output terminal CR<1> of the shift register A1 of the first shift register unit 1101.

In an i-th shift register unit 1101, display control signal terminals CR<N−4> of a shift register A(2i−1) and a shift register A(2i) are coupled to a shift signal output terminal CR<i−2> of an (i−2)-th shift register unit 1101.

A global reset signal terminal TRST of an N-th shift register unit 1101 is coupled to the start signal terminal STV. A first clock signal terminal CLKA of the N-th shift register unit 1101 is coupled to a corresponding first clock signal line. A compensation selection control signal terminal OE of the N-th shift register unit 1101 is coupled to a corresponding compensation selection control signal line. i is greater than or equal to 3 and is less than or equal to N (i.e., $3 \leq i \leq N$), and i is a variable that is a positive integer.

In some embodiments, the display panel includes a plurality of clock signal line groups. Each clock signal line group includes m clock signal lines. Waveforms of clock signals transmitted by the m clock signal lines are the same, and are sequentially shifted by half of a width of the waveform. For example, m is 10. For example, the display panel includes a second clock signal line group including CLKB_1 to CLKB_m, a third clock signal line group including CLKC_1 to CLKC_m, and a fourth clock signal line group including CLKD_1 to CLKD_m. In the case where m is 10, the second clock signal line group includes 10 second clock signal lines, i.e., CLKB_1 to CLKB_10; the third clock signal line group includes 10 third clock signal lines, i.e., CLKC_1 to CLKC_10, and the fourth clock signal line group includes 10 fourth clock signals lines, i.e., CLKD_1 to CLKD_10.

Based on the arrangement of the clock signal line groups, in some embodiments, as shown in FIG. 9, in the gate driving circuit 1100, first ten adjacent shift registers (e.g., A1, A2 ... A10), i.e., first five shift register units 1101, are taken as a group, and a connection relationship between the ten shift registers and the clock signal lines is as follows.

A second clock signal terminal CLKB_M of a (2t+1)-th shift register (e.g., A1, A3, A5, A7, A9) is coupled to a second clock signal line CLKB_2t+1, where t is greater than or equal to 0 and is less than or equal to 4 (i.e., $0 \leq t \leq 4$). For example, a second clock signal terminal CLKB_M of the shift register A1 is coupled to a second clock signal line CLKB_1, a second clock signal terminal CLKB_M of the shift register A3 is coupled to a second clock signal line CLKB_3, a second clock signal terminal CLKB_M of the shift register A5 is coupled to a second clock signal line CLKB_5, and so forth, and a second clock signal terminal CLKB_M of the shift register A9 is coupled to a second clock signal line CLKB_9.

A third clock signal terminal CLKC_M of the (2t+1)-th shift register (e.g., A1, A3, A5, A7, A9) is coupled to a third clock signal line CLKC_2t+1, where t is greater than or equal to 0 and is less than or equal to 4 (i.e., $0 \leq t \leq 4$). For example, a third clock signal terminal CLKC_M of the shift register A1 is coupled to a third clock signal line CLKC_1, a third clock signal terminal CLKC_M of the shift register A3 is coupled to a third clock signal line CLKC_3, a third clock signal terminal CLKC_M of the shift register A5 is coupled to a third clock signal line CLKC_5, and so forth, and a third clock signal terminal CLKC_M of the shift register A9 is coupled to a third clock signal line CLKC_9.

A fifth clock signal terminal CLKC_M+1 of a 2t-th shift register (e.g., A2, A4, A6, A8, A10) is coupled to a third clock signal line CLKC_2t, where t is greater than or equal to 1 and is less than or equal to 5 (i.e., $1 \leq t \leq 5$). For example, a fifth clock signal terminal CLKC_M+1 of the shift register A2 is coupled to a third clock signal line CLKC_2, a fifth clock signal terminal CLKC_M+1 of the shift register A4 is coupled to a third clock signal line CLKC_4, a fifth clock signal terminal CLKC_M+1 of the shift register A6 is coupled to a third clock signal line CLKC_6, and so forth, and the fifth clock signal terminal CLKC_M+1 of the shift register A10 is coupled to a third clock signal line CLKC_10.

A fourth clock signal terminal CLKD_M of the (2t+1)-th shift register (e.g., A1, A3, A5, A7, A9) is coupled to a fourth clock signal line CLKD_2t+1, where t is greater than or equal to 0 and is less than or equal to 4 (i.e., $0 \leq t \leq 4$). For example, a fourth clock signal terminal CLKD_M of the shift register A1 is coupled to a fourth clock signal line CLKD_1, a fourth clock signal terminal CLKD_M of the shift register A3 is coupled to a fourth clock signal line CLKD_3, a fourth clock signal terminal CLKD_M of the shift register A5 is coupled to a fourth clock signal line CLKD_5, and so forth, and a fourth clock signal terminal CLKD_M of the shift register A9 is coupled to a fourth clock signal line CLKD_9.

A sixth clock signal terminal CLKD_M+1 of the 2t-th shift register (e.g., A2, A4, A6, A8, A10) is coupled to a fourth clock signal line CLKD_2t, where t is greater than or equal to 1 and is less than or equal to 5 (i.e., 1≤t≤5). For example, a sixth clock signal terminal CLKD_M+1 of the shift register A2 is coupled to a fourth clock signal line CLKD_2, a sixth clock signal terminal CLKD_M+1 of the shift register A4 is coupled to a fourth clock signal line CLKD_4, a sixth clock signal terminal CLKD_M+1 of the shift register A6 is coupled to a fourth clock signal line CLKD_6, and so forth, and a sixth clock signal terminal CLKD_M+1 of the shift register A10 is coupled to a fourth clock signal line CLKD_10.

The connection relationship between the shift registers A1 to A10 and the clock signal lines are described above, and a connection relationship between remaining shift registers and clock signal lines may be similar to the connection relationship between the shift registers A1 to A10 and the clock signal lines. Every ten adjacent shift registers is taken as a group, and its connection relationship with clock signal line groups is taken as a repeating unit, and details will not be repeated here.

For example, as shown in FIGS. 2 to 8, in an example where each subscript N shown in the drawings is 11, a shift register A11 and a shift register A12 (i.e., the first input/output unit 310 and the second input/output unit 320) correspond to an eleventh row of sub-pixel units and a twelfth row of sub-pixel units, respectively. A second clock signal terminal CLKB_M of the shift register A11 is coupled to the second clock signal line CLKB_1; a third clock signal terminal CLKC_M of the shift register A11 is coupled to the third clock signal line CLKC_1; and a fourth clock signal terminal CLKD_M of the shift register A11 is coupled to the fourth clock signal line CLKD_1. A fifth clock signal terminal CLKC_M+1 of the shift register A12 is coupled to the third clock signal line CLKC_2; and a sixth clock signal terminal CLKD_M+1 of the shift register A12 is coupled to the fourth clock signal line CLKD_2.

In addition, the number of the clock signal lines in the gate driving circuit 1100 may be set according to actual needs, as long as clock signals can be provided to the first clock signal terminal CLKA to the fourth clock signal terminal CLKD_M in each shift register.

Since a shift signal CR output by each shift register unit 1101 may be used as a control signal of one or several shift register units cascaded to the shift register unit 1101, in some embodiments of the present disclosure, a shift signal CR may be provided to a display control signal terminal CR<N−4>, a display reset signal terminal CR<N+8>, etc., of a shift register unit 1101 by a corresponding shift register unit 1101 as a control signal. The embodiments of the present disclosure are not limited thereto.

It will be noted that, the cascaded manner of the shift register units 1101 shown in FIG. 9 is only an example. According to the description of the embodiments of the present disclosure, other cascaded manners may also be used according to actual conditions.

Figure 11:
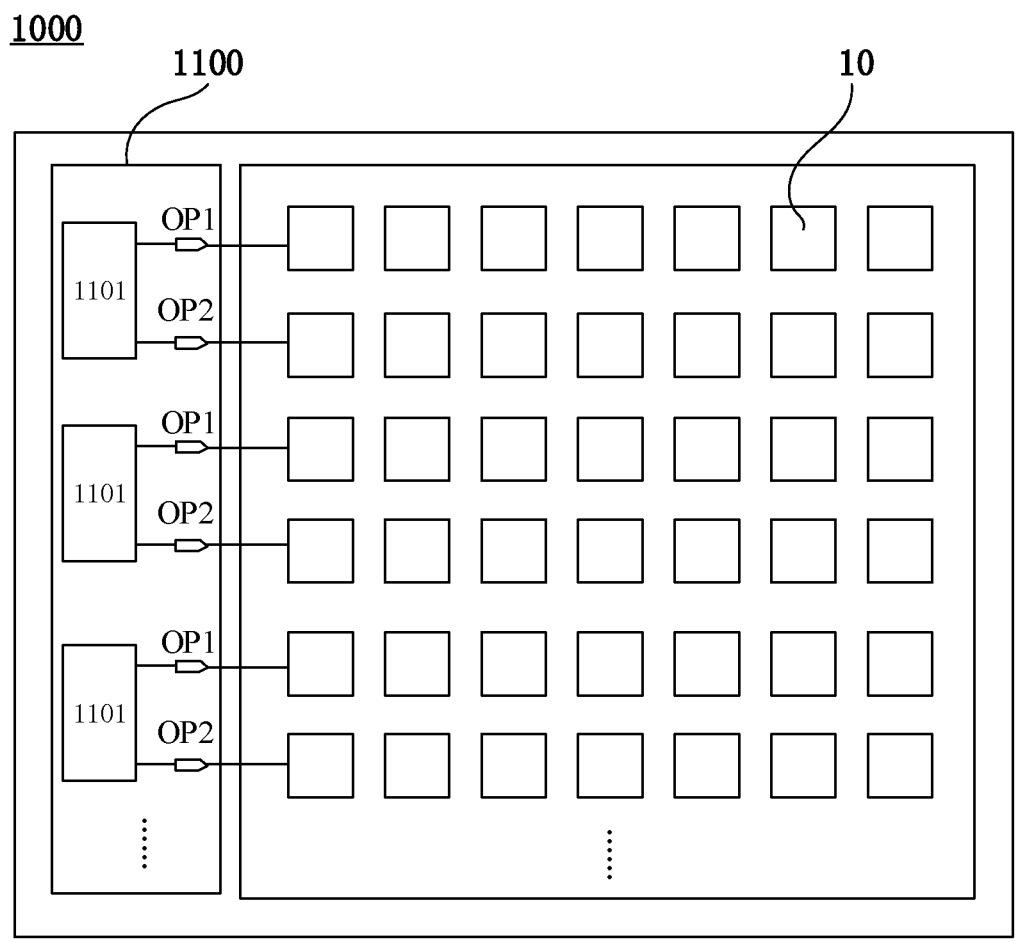
FIG. 11 is a structural diagram of a display device, in accordance with some embodiments of the present disclosure.

Embodiments of the present disclosure further provide a display device. As shown in FIG. 11, the display device 1000 includes gate driving circuit(s) 1100 and a plurality of sub-pixel units 10 arranged in an array. A first output terminal OP1 and a second output terminal OP2 of each shift register unit 1101 of the gate driving circuit 1100 are coupled to different rows of sub-pixel units 10. Beneficial effects that may be achieved by the display device 1000 provided in the embodiments of the present disclosure are the same as the beneficial effects that may be achieved by the gate driving circuit 1100 described above, and details will not be repeated here.

Based on the shift register unit 1101, embodiments of the present disclosure further provide a driving method for the shift register unit 1101. Beneficial effects that may be achieved by the driving method for the shift register unit 1101 provided in the embodiments of the present disclosure are the same as the beneficial effects that may be achieved by the shift register unit 1101, and details will not be repeated herein.

In some embodiments, the shift register unit 1101 is of the structure as shown in FIGS. 3 to 5. The driving method for the shift register unit 1101 includes following steps.

A frame period includes a display input period and a blanking input period. In the display input period, the display input circuit 200 charges the first pull-up node Q<N> and the second pull-up node Q<N+1> in response to the display control signal, and meanwhile, the first auxiliary input circuit 801 and the second auxiliary input circuit 802 are turned on; the first pull-down control circuit 401 pulls down the level of the first pull-down node QB_A<N> under control of both the level of the first pull-up node Q<N> and the first auxiliary input circuit 801, so as to turn off the first pull-down circuit 501; the second pull-down control circuit 402 pulls down the level of the second pull-down node QB_B<N> under control of both the level of the second pull-up node Q<N+1> and the second auxiliary input circuit 802, so as to turn off the second pull-down circuit 502.

In the blanking input period, the blanking input circuit 100 charges the first pull-up node Q<N> and the second pull-up node Q<N+1> in response to the blanking control signal, and meanwhile, the first auxiliary input circuit 801 and the second auxiliary input circuit 802 are turned on; the first pull-down control circuit 401 pulls down the level of the first pull-down node QB_A<N> under the control of both the level of the first pull-up node Q<N> and the first auxiliary input circuit 801, so as to turn off the first pull-down circuit 501; the second pull-down control circuit 402 pulls down the level of the second pull-down node QB_B<N> under control of both the level of the second pull-up node Q<N+1> and the second auxiliary input circuit 802, so as to turn off the second pull-down circuit 502.

In some other embodiments, the shift register unit is of the structure as shown in FIGS. 6 to 8. That is, the third auxiliary input circuit 803 is coupled to the first pull-down node QB_A<N>, and the fourth auxiliary input circuit 804 is coupled to the second pull-down node QB_B<N>. Based on the driving method described above, the driving method for the shift register unit further includes following steps.

In the display input period, the third auxiliary input circuit 803 directly pulls down the level of the first pull-down node QB_A<N> in response to the display control signal to turn off the first pull-down circuit 501; and the fourth auxiliary input circuit 804 directly pulls down the level of the second pull-down node QB_B<N> in response to the display control signal to turn off the second pull-down circuit 502.

In the blanking input period, the third auxiliary input circuit 803 directly pulls down the level of the first pull-down node QB_A<N> in response to the blanking control signal to turn off the first pull-down circuit 501; and the fourth auxiliary input circuit 804 directly pulls down the level of the second pull-down node QB_B<N> in response to the blanking control signal to turn off the second pull-down circuit 502.

In order to clearly describe the driving method for the shift register unit 1101, descriptions will be given below by taking an example of the shift register unit as shown in FIG. 7. It will be understood that, a driving method for another shift register unit 1101 of the gate driving circuit 1100 is the same as the driving method for the shift register unit 1101, and details will not be repeated here.

In embodiments of the present disclosure, the shift register unit 1101 is of the structure as shown in FIG. 7. For example, the shift register unit 1101 is used for driving sub-pixel units in the eleventh row and the twelfth row of the display device 1000. That is, each subscript N shown in FIG. 7 is 11. The driving timing diagram of the shift register unit 1101 is as shown in FIG. 10.

A frame period 1F includes a display period T1 and a blanking period T2.

In the display period T1:

In a first phase (i.e., an input phase), the compensation selection control signal terminal OE outputs a low level, so that the twenty-first transistor M21 of the compensation selection circuit 900 is turned off. In this case, a potential of the blanking pull-up control node H<11> is only influenced by the second voltage terminal VGL1.

The twenty-second transistor M22 is turned off. In addition, the first clock signal terminal CLKA outputs a low level, so that the twenty-third transistor M23 and the twenty-fourth transistor M24 of the blanking input circuit 100 are turned off.

The display control signal terminal CR<7> is input with a high-level signal, so that the twenty-fifth transistor M25 and the twenty-sixth transistor M26 of the display input circuit 200 are controlled to be turned on, to write the high-level signal provided by the display control signal terminal CR<7> into the first pull-up node Q<11> and the second pull-up node Q<12>. Meanwhile, the high-level signal provided by the display control signal terminal CR<7> controls and the fifth transistor M5 of the first auxiliary input circuit 801 and the fifteenth transistor M15 of the third auxiliary input circuit 803 to be turned on, and controls the twelfth transistor M12 of the second auxiliary input circuit 802 and the eighteenth transistor M18 of the fourth auxiliary input circuit 804 to be turned on. The high-level signal is written into the first pull-up node Q<11> and the second pull-up node Q<12>, and the first pull-up node Q<11> and the second pull-up node Q<12> are maintained at a high level.

The fifth transistor M5 of the first auxiliary input circuit 801 is turned on to pull down a potential of the first auxiliary node P1<11>, so that a potential of the control electrode of the second transistor M2 of the first pull-down control circuit 401 is pulled down. As a result, the second transistor M2 is controlled to be turned off. Thus, it is ensured that the high-level signal provided by the first voltage terminal VDD_A will not be transmitted to the first pull-down node QB_A<11>.

It will be understood that, either of the first voltage terminal VDD_A and the third voltage terminal VDD_B always maintains at the high level (i.e., one of the first voltage terminal VDD_A and the third voltage terminal VDD_B is in a working state). In a case where the third voltage terminal VDD_B is input with a high-level signal, since the twelfth transistor M12 of the second auxiliary input circuit 802 is turned on to pull down a potential of the second auxiliary node P2<11>, a potential of the control electrode of the ninth transistor M9 of the second pull-down control circuit 402 is pulled down. As a result, the ninth transistor M9 of the second pull-down control circuit 402 is controlled to be turned off. Thus, it is ensured that the high-level signal provided by the third voltage terminal VDD_B will not be transmitted to the second pull-down node QB_B<11>.

In this case, the fifteenth transistor M15 of the third auxiliary input circuit 803 pulls down a potential of the first pull-down node QB_A<11>, so that the twenty-eighth transistor M28 of the first pull-down circuit 501 and the fortieth transistor M40 of the second pull-down circuit 502 are controlled to be turned off. The eighteenth transistor M18 of the fourth auxiliary input circuit 804 pulls down a potential of the second pull-down node QB_B<11>, so that the twenty-seventh transistor M27 of the first pull-down circuit 501 and the forty-first transistor M41 of the second pull-down circuit 502 are controlled to be turned off. As a result, electric leakage from the first pull-up node Q<11> and the second pull-up node Q<12> to the second voltage terminal VGL1 are prevented.

In addition, the second clock signal terminal CLKB_M, the third clock signal terminal CLKC_M, the fourth clock signal terminal CLKD_M, the fifth clock signal terminal CLKC_M+1 and the sixth clock signal terminal CLKD_M+1 are each input with a low-level signal. Since the first pull-up node Q<11> maintains at the high level due to the second capacitor C2 and the third capacitor C3 of the first output circuit 301, the first pull-up node Q<11> controls the thirty-fifth transistor M35, the thirty-sixth transistor M36 and the thirty-seventh transistor M37 of the first output circuit 301 to be turned on, so that the first output circuit 301 outputs low-level signals. Moreover, since the second pull-up node Q<12> maintains at the high level due to the fourth capacitor C4 and the fifth capacitor C5 of the second output circuit 302, the second pull-up node Q<12> controls the forty-sixth transistor M46 and the forty-seventh transistor M47 of the second output circuit 302 to be turned on, so that the second output circuit 302 outputs low-level signals.

In a second phase, the second clock signal terminal CLKB_M, the third clock signal terminal CLKC_M, the fourth clock signal terminal CLKD_M and the compensation selection control signal terminal OE are each input with a high-level signal; the first clock signal terminal CLKA, the display control signal terminal CR<7> and the global reset signal terminal TRST are each input with a low-level signal; and either of the first voltage terminal VDD_A and the third voltage terminal VDD_B always maintains at the high level (i.e., one of the first voltage terminal VDD_A and the third voltage terminal VDD_B is in the working state).

In this case, the twenty-first transistor M21 of the compensation selection circuit 900 is turned on, so that the potential of the blanking pull-up control node H<11> is pulled up. The blanking pull-up control node H<11> controls the twenty-second transistor M22 of the blanking input circuit 100 to be turned on, and controls the seventh transistor M7 of the first auxiliary input circuit 801, the fourteenth transistor M14 of the second auxiliary input circuit 802, the seventeenth transistor M17 of the third auxiliary input circuit 803, and the twentieth transistor M20 of the fourth auxiliary input circuit 804 to be turned on.

In addition, the first clock signal terminal CLKA outputs the low-level signal, so that the twenty-third transistor M23 of the blanking input circuit 100 is controlled to be turned off, and the sixth transistor M6 of the first auxiliary input circuit 801 and the sixteenth transistor M16 of the third auxiliary input circuit 803 are controlled to be turned off.

The display control signal terminal CR<7> is input with the low-level signal, so that the twenty-fifth transistor M25 and the twenty-sixth transistor M26 of the display input circuit 200 are controlled to be turned off, and the fifth transistor M5 of the first auxiliary input circuit 801 and the fifteenth transistor M15 of the third auxiliary input circuit 803 are controlled to be turned off. In this case, the potential of the control electrode of the second transistor M2 of the first pull-down control circuit 401 will not be pulled down, so that the second transistor M2 is normally turned on to write the high-level signal provided by the first voltage terminal VDD_A into the first pull-down node QB_A<11>.

The high level of the first pull-down node QB_A<11> controls the twenty-eighth transistor M28, the twenty-ninth transistor M29, the thirty-first transistor M31, and the thirty-third transistor M33 of the first pull-down circuit 501 to be turned on, and controls the fortieth transistor M40, the forty-third transistor M43 and the forty-fifth transistor M45 of the second pull-down circuit 502 to be turned on.

The first pull-up node Q<11> maintains at the high level due to the second capacitor C2 and the third capacitor C3 to control the thirty-fifth transistor M35, the thirty-sixth transistor M36 and the thirty-seventh transistor M37 of the first output circuit 301 to be turned on, so that the shift signal output terminal CR<11>, the first pixel scanning signal output terminal OUT1<11> and the second pixel scanning signal output terminal OUT2<11> each output a high-level signal. Meanwhile, the high-level signals provided by the third clock signal terminal CLKC_M and the fourth clock signal terminal CLKD_M may also enable to further increase the potential of the first pull-up node Q<11> due to bootstrapping effects of the second capacitor C2 and the third capacitor C3.

In a third phase, the fifth clock signal terminal CLKC_M+1 and the sixth clock signal terminal CLKD_M+1 are each input with a high-level signal; the first clock signal terminal CLKA, the display control signal terminal CR<7>, the compensation selection control signal terminal OE and the global reset signal terminal TRST are each input with the low-level signal; and either of the first voltage terminal VDD_A and the third voltage terminal VDD_B always maintains at the high level (i.e., one of the first voltage terminal VDD_A and the third voltage terminal VDD_B is in the working state).

In this case, the first clock signal terminal CLKA outputs the low-level signal, so that the twenty-fourth transistor M24 of the blanking input circuit 100 is controlled to be turned off, and the thirteenth transistor M13 of the second auxiliary input circuit 802 and the nineteenth transistor M19 of the fourth auxiliary input circuit 804 are controlled to be turned off.

The display control signal terminal CR<7> is input with the low-level signal, so that the twenty-sixth transistor M26 of the display input circuit 200 is controlled to be turned off, and the twelfth transistor M12 of the second auxiliary input circuit 802 and the eighteenth transistor M18 of the fourth auxiliary input circuit 804 are controlled to be turned off. In this case, the potential of the control electrode of the ninth transistor M9 of the second pull-down control circuit 402 will not be pulled down, so that the ninth transistor M9 is normally turned on to write the high-level signal provided by the second voltage terminal VDD_B into the second pull-down node QB_B<11>.

The second pull-up node Q<12> maintains at the high level due to the fourth capacitor C4 and the fifth capacitor C5 to control the forty-sixth transistor M46 and the forty-seventh transistor M47 of the second output circuit 302 to be turned on. Since the fifth clock signal terminal CLKC_M+1 and the sixth clock signal terminal CLKD_M+1 are each input with the high-level signal, the third pixel scanning signal output terminal OUT1<12> and the fourth pixel scanning signal output terminal OUT2<12> each output a high-level signal. In addition, the high-level signals provided by the fifth clock signal terminal CLKC_M+1 and the sixth clock signal terminal CLKD_M+1 may also enable a potential of the second pull-up node Q<12> to be further increased due to bootstrapping effects of the fourth capacitor C4 and the fifth capacitor C5.

In a fourth phase, the first clock signal terminal CLKA, the display control signal terminal CR<7>, the second clock signal terminal CLKB_M, the third clock signal terminal CLKC_M and the fourth clock signal terminal CLKD_M are each input with a low-level signal; either of the first voltage terminal VDD_A and the third voltage terminal VDD_B always maintains at the high level (i.e., one of the first voltage terminal VDD_A and the third voltage terminal VDD_B is in the working state).

In this case, the compensation selection control signal terminal OE is input with the low-level signal, so that the twenty-first transistor M21 of the compensation selection circuit 900 is controlled to be turned off. In this case, the potential of the blanking pull-up control node H<11> maintains at the high potential under an action of the first capacitor C1 to control the twenty-second transistor M22 of the blanking input circuit 100 to be turned on.

The first clock signal terminal CLKA is input with the low-level signal, so that the twenty-third transistor M23 and the twenty-fourth transistor M24 of the blanking input circuit 100 are controlled to be turned off, the sixth transistor M6 of the first auxiliary input circuit 801 and the sixteenth transistor M16 of the third auxiliary input circuit 803 are controlled to be turned off, and the thirteenth transistor M13 of the second auxiliary input circuit 802 and the nineteenth transistor M19 of the fourth auxiliary input circuit 804 are controlled to be turned off.

The display control signal terminal CR<7> is input with the low-level signal, so that the twenty-fifth transistor M25 and the twenty-sixth transistor M26 of the display input circuit 200 are controlled to be turned off, the fifth transistor M5 of the first auxiliary input circuit 801 and the fifteenth transistor M15 of the third auxiliary input circuit 803 are controlled to be turned off, and the twelfth transistor M12 of the second auxiliary input circuit 802 and the eighteenth transistor M18 of the fourth auxiliary input circuit 804 are controlled to be turned off.

Since a display reset signal terminal CR<19> is input with the low-level signal, the thirty-eighth transistor M38 of the first display reset circuit 601 and the forty-eighth transistor M48 of the second display reset circuit 602 are controlled to be turned off.

Based on this, the first pull-up node Q<11> maintains at the high level due to the second capacitor C2 and the third capacitor C3. In this case, the high level of the first pull-up node Q<11> controls the thirty-fifth transistor M35, the thirty-sixth transistor M36 and the thirty-seventh transistor M37 of the first output circuit 301 to be turned on.

In this case, the shift signal output terminal CR<11>, the first pixel scanning signal output terminal OUT1<11> and the second pixel scanning signal output terminal OUT2<11> each output a low-level signal.

In addition, the second transistor M2 of the first pull-down control circuit 401 is turned on; the first pull-up node Q<11> outputs the high-level signal to control the fourth transistor M4 to be turned on, so that the potential of the first pull-down node QB_A<11> is pulled down. Thus, the twenty-eighth transistor M28, the twenty-ninth transistor M29, the thirty-first transistor M31, and the thirty-third transistor M33 of the first pull-down circuit 501 are turned off, and the fortieth transistor M40, the forty-third transistor M43, and the forty-fifth transistor M45 of the second pull-down circuit 502 are turned off.

The ninth transistor M9 of the second pull-down control circuit 402 is turned on; the second pull-up node Q<12> outputs the high-level signal to control the eleventh transistor M11 to be turned on, so that the potential of the second pull-down node QB_B<11> is pulled down. Thus, the twenty-seventh transistor M27, the thirtieth transistor M30, the thirty-second transistor M32, and the thirty-fourth transistor M34 of the first pull-down circuit 501 are turned off, and the forty-first transistor M41, the forty-second transistor M42, and the forty-fourth transistor M44 of the second pull-down circuit 502 are turned off.

In a fifth phase, the first clock signal terminal CLKA, the display control signal terminal CR<7>, the fifth clock signal terminal CLKC_M+1 and the sixth clock signal terminal CLKD_M+1 are each input with a low-level signal; and either of the first voltage terminal VDD_A and the third voltage terminal VDD_B always maintains at the high level (i.e., one of the first voltage terminal VDD_A and the third voltage terminal VDD_B is in the working state).

In this case, based on a voltage signal transmission in the fourth phase, the compensation selection control signal terminal OE is input with the low-level signal to control the twenty-first transistor M21 of the compensation selection circuit 900 to be turned off. In this case, the potential of the blanking pull-up control node H<11> maintains at the high level under the action of the first capacitor C1. Therefore, the blanking pull-up control node H<11> outputs the high-level signal to control the fourteenth transistor M14 of the second auxiliary input circuit 802 and the twentieth transistor M20 of the fourth auxiliary input circuit 804 to be turned on.

The first clock signal terminal CLKA is input with the low-level signal, so that the twenty-fourth transistor M24 of the blanking input circuit 100 is controlled to be turned off, and the thirteenth transistor M13 of the second auxiliary input circuit 802 and the nineteenth transistor M19 of the fourth auxiliary input circuit 804 are controlled to be turned off.

The display control signal terminal CR<7> is input with the low-level signal, so that the twenty-sixth transistor M26 of the display input circuit 200 is controlled to be turned off, and the twelfth transistor M12 of the second auxiliary input circuit 802 and the eighteenth transistor M18 of the fourth auxiliary input circuit 804 are controlled to be turned off.

The ninth transistor M9 of the second pull-down control circuit 402 is turned on. In this case, the second pull-up node Q<12> outputs the high-level signal to control the eleventh transistor M11 to be turned on, so that the potential of the second pull-down node QB_B<11> is further pulled down. Thus, the twenty-seventh transistor M27, the thirtieth transistor M30, the thirty-second transistor M32, and the thirty-fourth transistor M34 of the first pull-down circuit 501 are turned off, and the forty-first transistor M41, the forty-second transistor M42, and the forty-fourth transistor M44 of the second pull-down circuit 502 are turned off. As a result, the electric leakage from the second pull-up node Q<12> to the second voltage terminal VGL1 is prevented.

Since the display reset signal terminal CR<19> is input with the low-level signal, the forty-eighth transistor M48 of the second display reset circuit 602 is controlled to be turned off.

Based on this, the second pull-up node Q<12> maintains at the high potential due to the fourth capacitor C4 and the fifth capacitor C5 to control the forty-sixth transistor M46 and the forty-seventh transistor M47 of the second output circuit 302 to be turned on. As a result, the third pixel scanning signal output terminal OUT1<12> and the fourth pixel scanning signal output terminal OUT2<12> output low-level signals.

In a sixth phase, the display reset signal terminal CR<19> is input with a high-level signal, so that the thirty-eighth transistor M38 of the first display reset circuit 601 is controlled to be turned on, so that a level of the first pull-up node Q<11> is pulled down and thus the first pull-up node Q<11> is reset; and the forty-eighth transistor M48 of the second display reset circuit 602 is controlled to be turned on, so that a level of the second pull-up node Q<12> is pulled down and thus the second pull-up node Q<12> is reset. Either of the first voltage terminal VDD_A and the third voltage terminal VDD_B always maintains at the high level (i.e., one of the first voltage terminal VDD_A and the third voltage terminal VDD_B is in the working state).

Working states of the compensation selection circuit 900, the blanking input circuit 100, the display input circuit 200, the first auxiliary input circuit 801, the third auxiliary input circuit 803, the second auxiliary input circuit 802, the fourth auxiliary input circuit 804, the first pull-down control circuit 401, the second pull-down control circuit 402, the first pull-down circuit 501, and the second pull-down circuit 502 are the same as the working states of the circuits in the above driving processes in the fourth phase and the fifth phase, and details will not be repeated here.

It will be understood that, for the shift register unit, pulse widths of waveforms of signals of the compensation selection control signal terminal OE and the display control signal terminal CR<7> are the same. Here, the signal of the display control signal terminal CR<7> is provided by the shift signal output terminal CR<7> of a shift register unit corresponding to a seventh row of sub-pixel units. Therefore, the signal provided by the shift signal output terminal CR<7> of the shift register unit corresponding to the seventh row of sub-pixel units will charge the blanking pull-up control node H<11> of the compensation selection circuit 900 of the shift register unit, so as to ensure that after the compensation selection control signal terminal OE is input with the low-level signal, the high level of the blanking pull-up control node H<11> is maintained until the blanking period T2. Of course, optionally, the signal of the display control signal terminal CR<7> is provided by an enable signal line STU.

In the display period T1, the first clock signal terminal CLKA is always input with the low-level signal to control the twenty-third transistor M23 and the twenty-fourth transistor M24 of the blanking input circuit 100 to be turned off. Thus, the influence of the blanking pull-up control node H<11> on the shift register unit may be effectively avoided.

In addition, according to the driving method for the shift register unit in the display period T1, the display driving of the sub-pixel units 10 in all rows in the display period T1 by the gate driving circuit(s) may be performed row-by-row.

In the Blanking Period T2:

In a first phase (i.e., an input phase), the first clock signal terminal CLKA is input with the high-level signal. The twenty-third transistor M23 and the twenty-fourth transistor M24 of the blanking input circuit 100 are turned on, the sixth transistor M6 of the first auxiliary input circuit 801 and the sixteenth transistor M16 of the third auxiliary input circuit 803 are controlled to be turned on, and the thirteenth transistor M13 of the second auxiliary input circuit 802 and the nineteenth transistor M19 of the fourth auxiliary input circuit 804 are controlled to be turned on.

The compensation selection control signal terminal OE is input with the low-level signal, so that the blanking pull-up control node H<11> of the compensation selection circuit 900 maintains at the high level under the action of the first capacitor C1. The high level of the blanking pull-up control node H<11> controls the twenty-second transistor M22 of the blanking input circuit 100 to be turned on, so that the high-level signal provided by the first clock signal terminal CLKA is transmitted to the first pull-up node Q<11> and the second pull-up node Q<12>. In addition, the high level of the blanking pull-up control node H<11> controls the seventh transistor M7 of the first auxiliary input circuit 801 and the seventeenth transistor M17 of the third auxiliary input circuit to be turned on, and controls the fourteenth transistor M14 of the second auxiliary input circuit 802 and the twentieth transistor M20 of the fourth auxiliary input circuit 804 to be turned on.

In addition, the sixth transistor M6 and the seventh transistor M7 of the first auxiliary input circuit 801 are turned on to pull down the potential of the first auxiliary node P1<11>, so that the second transistor M2 of the first pull-down control circuit 401 is controlled to be turned off. Thus, it is ensured that the high-level signal provided by the first voltage terminal VDD_A will not be transmitted to the first pull-down node QB_A<11>. The thirteenth transistor M13 and the fourteenth transistor M14 of the second auxiliary input circuit 802 are turned on to pull down the potential of the second auxiliary node P2<11>, so that the ninth transistor M9 of the second pull-down control circuit 402 is controlled to be turned off. Thus, it is ensured that the high-level signal provided by the third voltage terminal VDD_B will not be transmitted to the second pull-down node QB_B<11>.

Moreover, the sixteenth transistor M16 and the seventeenth transistor M17 of the third auxiliary input circuit 803 are turned on to pull down the potential of the first pull-down node QB_A<11>. The nineteenth transistor M19 and the twentieth transistor M20 of the fourth auxiliary input circuit 804 are turned on to pull down the potential of the second pull-down node QB_B<11>. As a result, the twenty-seventh transistor M27 and the twenty-eighth transistor M28 of the first pull-down circuit 501 and the fortieth transistor M40 and the forty-first transistor M41 of the second pull-down circuit 502 are turned off. Therefore, the electric leakage from the first pull-up node Q<11> and the second pull-up node Q<12> to the second voltage terminal VGL1 may be prevented, thereby enhancing an ability of writing the high-level signals into the first pull-up node Q<11> and the second pull-up node Q<12>.

In a second phase, the first clock signal terminal CLKA and the second clock signal terminal CLKB_M are each input with the low-level signal; and the third clock signal terminal CLKC_M and the fourth clock signal terminal CLKD_M are each input with the high-level signal.

In addition, the compensation selection control signal terminal OE, the display control signal terminal CR<7>, and the display reset signal terminal CR<19> are each input with the low-level signal.

The compensation selection control signal terminal OE is input with the low-level signal to control the twenty-first transistor M21 of the compensation selection circuit 900 to be turned off. In this case, the potential of the blanking pull-up control node H<11> maintains at the high level under the action of the first capacitor C1 to control the twenty-second transistor M22 of the blanking input circuit 100 to be turned on.

The first clock signal terminal CLKA is input with the low-level signal, so that the twenty-third transistor M23 and the twenty-fourth transistor M24 of the blanking input circuit 100 are controlled to be turned off, the sixth transistor M6 of the first auxiliary input circuit 801 and the sixteenth transistor M16 of the third auxiliary input circuit 803 are controlled to be turned off, and the thirteenth transistor M13 of the second auxiliary input circuit 802 and the nineteenth transistor M19 of the fourth auxiliary input circuit 804 are controlled to be turned off.

The display control signal terminal CR<7> is input with the low-level signal, so that the twenty-fifth transistor M25 and the twenty-sixth transistor M26 of the display input circuit 200 are controlled to be turned off, the fifth transistor M5 of the first auxiliary input circuit 801 and the fifteenth transistor M15 of the third auxiliary input circuit 803 are controlled to be turned off, and the twelfth transistor M12 of the second auxiliary input circuit 802 and the eighteenth transistor M18 of the fourth auxiliary input circuit 804 are controlled to be turned off.

Since the display reset signal terminal CR<19> is input with the low-level signal, the thirty-eighth transistor M38 of the first display reset circuit 601 and the forty-eighth transistor M48 of the second display reset circuit 602 are controlled to be turned off.

Based on this, the first pull-up node Q<11> is at and maintains at the high level due to the second capacitor C2 and the third capacitor C3. The second pull-up node Q<12> is at and maintains at the high level due to the fourth capacitor C4 and the fifth capacitor C5.

The high level of the first pull-up node Q<11> controls the thirty-fifth transistor M35, the thirty-sixth transistor M36 and the thirty-seventh transistor M37 of the first output circuit 301 to be turned on, so that the first pixel scanning signal output terminal OUT1<11> and the second pixel scanning signal output terminal OUT2<11> each output the high-level signal.

In a third phase, the third clock signal terminal CLKC_M and the fourth clock signal terminal CLKD_M are each input with the low-level signal. The compensation selection control signal terminal OE, the first clock signal terminal CLKA, the display control signal terminal CR<7>, and the display reset signal terminal CR<19> are each input with the low-level signal.

The compensation selection control signal terminal OE is input with the low-level signal, so that the blanking pull-up control node H<11> of the compensation selection circuit 900 maintains at the high level under the action of the first capacitor C1. The high level of the blanking pull-up control node H<11> controls the twenty-second transistor M22 of the blanking input circuit 100 to be turned on. The first clock signal terminal CLKA is input with the low-level signal, so that the twenty-third transistor M23 and the twenty-fourth transistor M24 of the blanking input circuit 100 are controlled to be turned off, the sixth transistor M6 of the first auxiliary input circuit 801 and the sixteenth transistor M16 of the third auxiliary input circuit 803 are controlled to be turned off, and the thirteenth transistor M13 of the second auxiliary input circuit 802 and the nineteenth transistor M19 of the fourth auxiliary input circuit 804 are controlled to be turned off.

The display control signal terminal CR<7> is input with the low-level signal, so that the twenty-fifth transistor M25 and the twenty-sixth transistor M26 of the display input circuit 200 are controlled to be turned off, the fifth transistor M5 of the first auxiliary input circuit 801 and the fifteenth transistor M15 of the third auxiliary input circuit 803 are controlled to be turned off, and the twelfth transistor M12 of the second auxiliary input circuit 802 and the eighteenth transistor M18 of the fourth auxiliary input circuit 804 are controlled to be turned off.

Since the display reset signal terminal CR<19> is input with the low-level signal, the thirty-eighth transistor M38 of the first display reset circuit 601 and the forty-eighth transistor M48 of the second display reset circuit 602 are controlled to be turned off.

Based on this, the first pull-up node Q<11> is at and maintains at the high level due to the second capacitor C2 and the third capacitor C3. The second pull-up node Q<12> is at and maintains at the high level due to the fourth capacitor C4 and the fifth capacitor C5.

The high level of the first pull-up node Q<11> controls the thirty-fifth transistor M35, the thirty-sixth transistor M36 and the thirty-seventh transistor M37 of the first output circuit 301 to be turned on, so that the first pixel scanning signal output terminal OUT1<11> and the second pixel scanning signal output terminal OUT2<11> each output the low-level signal.

In a fourth phase, the compensation selection control signal terminal OE and the global reset signal terminal TRST are each input with the high-level signal. The third clock signal terminal CLKC_M and the fourth clock signal terminal CLKD_M are each input with the high-level signal.

The high level of the global reset signal terminal TRST controls the thirty-ninth transistor M39 of the first global reset circuit 701 to be turned on, and controls the forty-ninth transistor M49 of the second global reset circuit 702 to be turned on. The high level of the compensation selection control signal terminal OE controls the twenty-first transistor M21 of the compensation selection circuit 900 to be turned on.

Blanking pull-up control nodes H<11>, first pull-up nodes Q<11> and second pull-up nodes Q<12> of the shift register units 1101 corresponding to the sub-pixel units of all the rows are reset. Here, optionally, the signal of the global reset signal terminal TRST is provided by the enable signal line STU.

Working states of the compensation selection circuit 900, the blanking input circuit 100, the display input circuit 200, the first auxiliary input circuit 801, the third auxiliary input circuit 803, the second auxiliary input circuit 802, the fourth auxiliary input circuit 804, the first pull-down control circuit 401, the second pull-down control circuit 402, the first pull-down circuit 501, and the second pull-down circuit 502 are the same as the working states thereof in the second phase, and details will not be repeated here.

It will be understood that, the driving method for the shift register unit as shown in other drawings in the examples of the present disclosure may be achieved with reference to this example, and details will not be repeated in the embodiments of the present disclosure.

In the description of the above embodiments, specific features, structures, materials or characteristics may be combined in any suitable manner in any one or more embodiments or examples. A shift register 1102 in an odd row and a shift register 1102 in an adjacent even row of the shift register unit 1101 provided in the embodiment of the present disclosure may be used together to control the driving of sub-pixel units in a respective row, or each shift register 1102 of the shift register unit 1101 may be used separately to control the driving of sub-pixel units 10 in a respective row.

The description described above is merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A shift register unit, comprising a first input/output unit and a second input/output unit, wherein
the first input/output unit includes a first pull-down control circuit and a first auxiliary input circuit, the first pull-down control circuit is coupled to a first pull-up node and a first pull-down node, the first auxiliary input circuit is coupled to the first pull-down control circuit, the first auxiliary input circuit is configured to control the first pull-down control circuit together with a level of the first pull-up node in response to a display control signal and a blanking control signal; and the first pull-down control circuit is configured to control a level of the first pull-down node under control of both the level of the first pull-up node and the first auxiliary input circuit; and
the second input/output unit includes a second pull-down control circuit and a second auxiliary input circuit, the second pull-down control circuit is coupled to a second pull-up node and a second pull-down node; the second auxiliary input circuit is coupled to the second pull-down control circuit; the second auxiliary input circuit is configured to control the second pull-down control circuit together with a level of the second pull-up node in response to the display control signal and the blanking control signal; and the second pull-down control circuit is configured to control a level of the second pull-down node under control of both the level of the second pull-up node and the second auxiliary input circuit.

2. The shift register unit according to claim 1, wherein
the first pull-down control circuit includes a first transistor, a second transistor, a third transistor and a fourth transistor; a control electrode of the first transistor is coupled to a first voltage terminal, a first electrode of the first transistor is coupled to the first voltage terminal, and a second electrode of the first transistor is coupled to a first auxiliary node and a control electrode of the second transistor; a first electrode of the second transistor is coupled to the first voltage terminal, and a second electrode of the second transistor is coupled to the first pull-down node; a control electrode of the third transistor is coupled to the first pull-up node, a first electrode of the third transistor is coupled to the first auxiliary node, and a second electrode of the third transistor is coupled to a second voltage terminal; and a control electrode of the fourth transistor is coupled to the first pull-up node, a first electrode of the fourth transistor is coupled to the first pull-down node, and a second electrode of the fourth transistor is coupled to the second voltage terminal; and
the first auxiliary input circuit includes a fifth transistor, a sixth transistor and a seventh transistor; a control electrode of the fifth transistor is coupled to a display control signal terminal, a first electrode of the fifth transistor is coupled to the first auxiliary node, and a second electrode of the fifth transistor is coupled to the second voltage terminal; a control electrode of the sixth transistor is coupled to a first clock signal terminal, a first electrode of the sixth transistor is coupled to the first auxiliary node, and a second electrode of the sixth transistor is coupled to a first electrode of the seventh transistor; and a control electrode of the seventh transistor is coupled to a blanking pull-up control node, and a second electrode of the seventh transistor is coupled to the second voltage terminal.

3. The shift register unit according to claim 1, wherein
the second pull-down control circuit includes an eighth transistor, a ninth transistor, a tenth transistor and an eleventh transistor; a control electrode of the eighth transistor is coupled to a third voltage terminal, a first electrode of the eighth transistor is coupled to the third voltage terminal, and a second electrode of the eighth transistor is coupled to a second auxiliary node and a control electrode of the ninth transistor; a first electrode of the ninth transistor is coupled to the third voltage terminal, and a second electrode of the ninth transistor is coupled to the second pull-down node; a control electrode of the tenth transistor is coupled to the second pull-up node, a first electrode of the tenth transistor is coupled to the second auxiliary node, and a second electrode of the tenth transistor is coupled to a second voltage terminal; and a control electrode of the eleventh transistor is coupled to the second pull-up node, a first electrode of the eleventh transistor is coupled to the second pull-down node, and a second electrode of the eleventh transistor is coupled to the second voltage terminal; and the second auxiliary input circuit includes a twelfth transistor, a thirteenth transistor and a fourteenth transistor; a control electrode of the twelfth transistor is coupled to a display control signal terminal, a first electrode of the twelfth transistor is coupled to the second auxiliary node, and a second electrode of the twelfth transistor is coupled to the second voltage terminal; a control electrode of the thirteenth transistor is coupled to a first clock signal terminal, a first electrode of the thirteenth transistor is coupled to the second auxiliary node, and a second electrode of the thirteenth transistor is coupled to a first electrode of the fourteenth transistor; and a control electrode of the fourteenth transistor is coupled to a blanking pull-up control node, and a second electrode of the fourteenth transistor is coupled to the second voltage terminal.

4. The shift register unit according to claim 1, wherein
the first pull-down control circuit includes a first transistor, a second transistor, a third transistor and a fourth transistor; a control electrode of the first transistor is coupled to a first voltage terminal, a first electrode of the first transistor is coupled to the first voltage terminal, and a second electrode of the first transistor is coupled to a first auxiliary node and a control electrode of the second transistor; a first electrode of the second transistor is coupled to the first voltage terminal, and a second electrode of the second transistor is coupled to the first pull-down node; a control electrode of the third transistor is coupled to the first pull-up node, a first electrode of the third transistor is coupled to the first auxiliary node, and a second electrode of the third transistor is coupled to a second voltage terminal; and a control electrode of the fourth transistor is coupled to the first pull-up node, a first electrode of the fourth transistor is coupled to the first pull-down node, and a second electrode of the fourth transistor is coupled to the second voltage terminal;

the second pull-down control circuit includes an eighth transistor, a ninth transistor, a tenth transistor and an eleventh transistor; a control electrode of the eighth transistor is coupled to a third voltage terminal, a first electrode of the eighth transistor is coupled to the third voltage terminal, and a second electrode of the eighth transistor is coupled to a second auxiliary node and a control electrode of the ninth transistor; a first electrode of the ninth transistor is coupled to the third voltage terminal, and a second electrode of the ninth transistor is coupled to the second pull-down node; a control electrode of the tenth transistor is coupled to the second pull-up node, a first electrode of the tenth transistor is coupled to the second auxiliary node, and a second electrode of the tenth transistor is coupled to the second voltage terminal; and a control electrode of the eleventh transistor is coupled to the second pull-up node, a first electrode of the eleventh transistor is coupled to the second pull-down node, and a second electrode of the eleventh transistor is coupled to the second voltage terminal;

the first auxiliary input circuit includes a fifth transistor, a sixth transistor and a seventh transistor; a control electrode of the fifth transistor is coupled to a display control signal terminal, a first electrode of the fifth transistor is coupled to the first auxiliary node, and a second electrode of the fifth transistor is coupled to the second voltage terminal; a control electrode of the sixth transistor is coupled to a first clock signal terminal, a first electrode of the sixth transistor is coupled to the first auxiliary node, and a second electrode of the sixth transistor is coupled to a third auxiliary node; and a control electrode of the seventh transistor is coupled to a blanking pull-up control node, a first electrode of the seventh transistor is coupled to the third auxiliary node, and a second electrode of the seventh transistor is coupled to the second voltage terminal; and the second auxiliary input circuit includes a twelfth transistor and a fourteenth transistor; a control electrode of the twelfth transistor is coupled to the display control signal terminal, a first electrode of the twelfth transistor is coupled to the second auxiliary node, and a second electrode of the twelfth transistor is coupled to the second voltage terminal; and a control electrode of the fourteenth transistor is coupled to the blanking pull-up control node, a first electrode of the fourteenth transistor is coupled to the third auxiliary node, and a second electrode of the fourteenth transistor is coupled to the second voltage terminal.

5. The shift register according to claim 1, wherein the first input/output unit further includes a third auxiliary input circuit, and the second input/output unit further includes a fourth auxiliary input circuit;
the third auxiliary input circuit is coupled to the first pull-down node, and the third auxiliary input circuit is configured to control the level of the first pull-down node in response to the display control signal and the blanking control signal; and
the fourth auxiliary input circuit is coupled to the second pull-down node, and the fourth auxiliary input circuit is configured to control the level of the second pull-down node in response to the display control signal and the blanking control signal.

6. The shift register unit according to claim 5, wherein
the third auxiliary input circuit includes a fifteenth transistor, a sixteenth transistor and a seventeenth transistor;
a control electrode of the fifteenth transistor is coupled to a display control signal terminal, a first electrode of the fifteenth transistor is coupled to the first pull-down node, and a second electrode of the fifteenth transistor is coupled to a second voltage terminal; a control electrode of the sixteenth transistor is coupled to a first clock signal terminal, a first electrode of the sixteenth transistor is coupled to the first pull-down node, and a second electrode of the sixteenth transistor is coupled to a first electrode of the seventeenth transistor; and a control electrode of the seventeenth transistor is coupled to a blanking pull-up control node, and a second electrode of the seventeenth transistor is coupled to the second voltage terminal.

7. The shift register unit according to claim 5, wherein the fourth auxiliary input circuit includes an eighteenth transistor, a nineteenth transistor and a twentieth transistor;
a control electrode of the eighteenth transistor is coupled to a display control signal terminal, a first electrode of the eighteenth transistor is coupled to the second pull-down node, and a second electrode of the eighteenth transistor is coupled to a second voltage terminal; a control electrode of the nineteenth transistor is coupled to a first clock signal terminal, a first electrode of the nineteenth transistor is coupled to the second pull-down node, and a second electrode of the nineteenth transistor is coupled to a first electrode of the twentieth transistor; and a control electrode of the twentieth transistor is coupled to a blanking pull-up control node, and a second electrode of the twentieth transistor is coupled to the second voltage terminal.

8. The shift register unit according to claim 5, wherein the first pull-down control circuit includes a first transistor, a second transistor, a third transistor and a fourth transistor; a control electrode of the first transistor is coupled to a first voltage terminal, a first electrode of the first transistor is coupled to the first voltage terminal, and a second electrode of the first transistor is coupled to a first auxiliary node and a control electrode of the second transistor; a first electrode of the second transistor is coupled to the first voltage terminal, and a second electrode of the second transistor is coupled to the first pull-down node; a control electrode of the third transistor is coupled to the first pull-up node, a first electrode of the third transistor is coupled to the first auxiliary node, and a second electrode of the third transistor is coupled to a second voltage terminal; and a control electrode of the fourth transistor is coupled to the first pull-up node, a first electrode of the fourth transistor is coupled to the first pull-down node, and a second electrode of the fourth transistor is coupled to the second voltage terminal;
the second pull-down control circuit includes an eighth transistor, a ninth transistor, a tenth transistor and an eleventh transistor; a control electrode of the eighth transistor is coupled to a third voltage terminal, a first electrode of the eighth transistor is coupled to the third voltage terminal, and a second electrode of the eighth transistor is coupled to a second auxiliary node and a control electrode of the ninth transistor; a first electrode of the ninth transistor is coupled to the third voltage terminal, and a second electrode of the ninth transistor is coupled to the second pull-down node; a control electrode of the tenth transistor is coupled to the second pull-up node, a first electrode of the tenth transistor is coupled to the second auxiliary node, and a second electrode of the tenth transistor is coupled to the second voltage terminal; and a control electrode of the eleventh transistor is coupled to the second pull-up node, a first electrode of the eleventh transistor is coupled to the second pull-down node, and a second electrode of the eleventh transistor is coupled to the second voltage terminal;

the first auxiliary input circuit includes a fifth transistor, a sixth transistor and a seventh transistor; a control electrode of the fifth transistor is coupled to a display control signal terminal, a first electrode of the fifth transistor is coupled to the first auxiliary node, and a second electrode of the fifth transistor is coupled to the second voltage terminal; a control electrode of the sixth transistor is coupled to a first clock signal terminal, a first electrode of the sixth transistor is coupled to the first auxiliary node, and a second electrode of the sixth transistor is coupled to a third auxiliary node; and a control electrode of the seventh transistor is coupled to a blanking pull-up control node, a first electrode of the seventh transistor is coupled to the third auxiliary node, and a second electrode of the seventh transistor is coupled to the second voltage terminal; and the second auxiliary input circuit includes a twelfth transistor and a fourteenth transistor; a control electrode of the twelfth transistor is coupled to the display control signal terminal, a first electrode of the twelfth transistor is coupled to the second auxiliary node, and a second electrode of the twelfth transistor is coupled to the second voltage terminal; and a control electrode of the fourteenth transistor is coupled to the blanking pull-up control node, a first electrode of the fourteenth transistor is coupled to the third auxiliary node, and a second electrode of the fourteenth transistor is coupled to the second voltage terminal;

the first auxiliary input circuit is coupled to a-the third auxiliary node, the third auxiliary input circuit includes a fifteenth transistor and a seventeenth transistor; a control electrode of the fifteenth transistor is coupled to a-the display control signal terminal, a first electrode of the fifteenth transistor is coupled to the first pull-down node, and a second electrode of the fifteenth transistor is coupled to a-the second voltage terminal; and a control electrode of the seventeenth transistor is coupled to a-the blanking pull-up control node, a first electrode of the seventeenth transistor is coupled to the third auxiliary node, and a second electrode of the seventeenth transistor is coupled to the second voltage terminal; and the fourth auxiliary input circuit includes an eighteenth transistor and a twentieth transistor; a control electrode of the eighteenth transistor is coupled to the display control signal terminal, a first electrode of the eighteenth transistor is coupled to the second pull-down node, and a second electrode of the eighteenth transistor is coupled to the second voltage terminal; and a control electrode of the twentieth transistor is coupled to the blanking pull-up control node, a first electrode of the twentieth transistor is coupled to the third auxiliary node, and a second electrode of the twentieth transistor is coupled to the second voltage terminal.

9. The shift register unit according to claim 1, wherein the shift register unit further comprises:
a blanking input circuit coupled to the first pull-up node and the second pull-up node, the blanking input circuit being configured to charge the first pull-up node and the second pull-up node in response to the blanking control signal; and
a display input circuit coupled to the first pull-up node and the second pull-up node, the display input circuit being configured to charge the first pull-up node and the second pull-up node in response to the display control signal, wherein the first input/output unit has a first output terminal; and the first input/output unit is configured to output a first composite output signal to the first output terminal under control of the level of the first pull-up node; and the second input/output unit has a second output terminal; and the second input/output unit is configured to output a second composite output signal to the second output terminal under control of the level of the second pull-up node.

10. The shift register unit according to claim 9, further comprising a compensation selection circuit coupled to the blanking input circuit, the compensation selection circuit being configured to output a blanking pull-up control signal in the blanking control signal to the blanking input circuit in response to a compensation selection control signal.

11. The shift register unit according to claim 10, wherein the first input/output unit further includes a first pull-down circuit, a first output circuit, a first display reset circuit and a first global reset circuit, and the second input/output unit further includes a second pull-down circuit, a second output circuit, a second display reset circuit and a second global reset circuit, wherein the first pull-down circuit is coupled to the first pull-down node, the first pull-up node and the first output terminal, and the first pull-down circuit is configured to pull down levels of the first pull-up node and the first output terminal under control of the level of the first pull-down node to reset the first pull-up node and the first output terminal;

the first output circuit is coupled to the first pull-up node and the first output terminal, and the first output circuit is configured to output the first composite output signal to the first output terminal under the control of the level of the first pull-up node;

the first display reset circuit is coupled to a display reset signal terminal, the first pull-up node and a second voltage terminal, and the first display reset circuit is configured to output a signal provided via the second voltage terminal received from the display reset signal terminal to the first pull-up node in response to the display reset signal, so as to reset the level of the first pull-up node;

the first global reset circuit is coupled to a global reset signal terminal, the first pull-up node and the second voltage terminal, and the first global reset circuit is configured to output the signal provided via the second voltage terminal received from the global reset signal terminal to the first pull-up node in response to the global reset signal, so as to reset the level of the first pull-up node;

the second output circuit is coupled to the second pull-up node and the second output terminal, and the second output circuit is configured to output the second composite output signal to the second output terminal under the control of the level of the second pull-up node;

the second pull-down circuit is coupled to the second pull-up node, the second output terminal and the second pull-down node, and the second pull-down circuit is configured to pull down levels of the second pull-up node and the second output terminal under control of the level of the second pull-down node to reset the second pull-up node and the second output terminal;

the second display reset circuit is coupled to the display reset signal terminal, the second pull-up node and the second voltage terminal, and the second display reset circuit is configured to output the signal provided via the second voltage terminal received from the display reset signal terminal to the second pull-up node in response to the display reset signal, so as to reset the level of the second pull-up node; and the second global reset circuit is coupled to the global reset signal terminal, the second pull-up node and the second voltage terminal, and the second global reset circuit is configured to output the signal provided via the second voltage terminal received from the global reset signal terminal to the second pull-up node in response to the global reset signal, so as to reset the level of the second pull-up node.

12. The shift register unit according to claim 11, wherein the first output circuit includes a thirty-fifth transistor, a thirty-sixth transistor, a thirty-seventh transistor, a second capacitor and a third capacitor; a control electrode of the thirty-fifth transistor is coupled to the first pull-up node, a first electrode of the thirty-fifth transistor is coupled to a second clock signal terminal, and a second electrode of the thirty-fifth transistor is coupled to a shift signal output terminal; a control electrode of the thirty-sixth transistor is coupled to the first pull-up node, a first electrode of the thirty-sixth transistor is coupled to a third clock signal terminal, and a second electrode of the thirty-sixth transistor is coupled to a first pixel scanning signal output terminal; a control electrode of the thirty-seventh transistor is coupled to the first pull-up node, a first electrode of the thirty-seventh transistor is coupled to a fourth clock signal terminal, and a second electrode of the thirty-seventh transistor is coupled to a second pixel scanning signal output terminal; a first electrode of the second capacitor is coupled to the control electrode of the thirty-sixth transistor, and a second electrode of the second capacitor is coupled to the first pixel scanning signal output terminal; and a first electrode of the third capacitor is coupled to the control electrode of the thirty-seventh transistor, and a second electrode of the third capacitor is coupled to the second pixel scanning signal output terminal;

the first pull-down circuit includes a twenty-seventh transistor, a twenty-eighth transistor, a twenty-ninth transistor, a thirtieth transistor, a thirty-first transistor, a thirty-second transistor, a thirty-third transistor and a thirty-fourth transistor; a control electrode of the twenty-seventh transistor is coupled to the second pull-down node, a first electrode of the twenty-seventh transistor is coupled to the first pull-up node, and a second electrode of the twenty-seventh transistor is coupled to a second voltage terminal; a control electrode of the twenty-eighth transistor is coupled to the first pull-down node, a first electrode of the twenty-eighth transistor is coupled to the first pull-up node, and a second electrode of the twenty-eighth transistor is coupled to the second voltage terminal; a control electrode of the twenty-ninth transistor is coupled to the first pull-down node, a first electrode of the twenty-ninth transistor is coupled to the shift signal output terminal, and a second electrode of the twenty-ninth transistor is coupled to the second voltage terminal; a control electrode of the thirtieth transistor is coupled to the second pull-down node, a first electrode of the thirtieth transistor is coupled to the shift signal output terminal, and a second electrode of the thirtieth transistor is coupled to the second voltage terminal; a control electrode of the thirty-first transistor is coupled to the first pull-down node, a first electrode of the thirty-first transistor is coupled to the first pixel scanning signal output terminal, and a second electrode of the thirty-first transistor is coupled to a fourth voltage terminal; a control electrode of the thirty-second transistor is coupled to the second pull-down node, a first electrode of the thirty-second transistor is coupled to the first pixel scanning signal output terminal, and a second electrode of the thirty-second transistor is coupled to the fourth voltage terminal; a control electrode of the thirty-third transistor is coupled to the first pull-down node, a first electrode of the thirty-third transistor is coupled to the second pixel scanning signal output terminal, and a second electrode of the thirty-third transistor is coupled to the fourth voltage terminal; and a control electrode of the thirty-fourth transistor is coupled to the second pull-down node, a first electrode of the thirty-fourth transistor is coupled to the second pixel scanning signal output terminal, and a second electrode of the thirty-fourth transistor is coupled to the fourth voltage terminal;

the first display reset circuit includes a thirty-eighth transistor; and a control electrode of the thirty-eighth transistor is coupled to the display reset signal terminal, a first electrode of the thirty-eighth transistor is coupled to the first pull-up node, and a second electrode of the thirty-eighth transistor is coupled to the second voltage terminal; and the first global reset circuit includes a thirty-ninth transistor; and a control electrode of the thirty-ninth transistor is coupled to the global reset signal terminal, a first electrode of the thirty-ninth transistor is coupled to the first pull-up node, and a second electrode of the thirty-ninth transistor is coupled to the second voltage terminal.

13. A gate driving circuit, comprising a plurality of shift register units according to claim 1 that are cascaded.

14. A display device, comprising the gate driving circuit according to claim 13 and a plurality of sub-pixel units arranged in an array, wherein
a first output terminal and a second output terminal of each shift register unit of the gate driving circuit are coupled to different rows of sub-pixel units.

15. A driving method for a shift register unit, applied to the shift register unit according to claim 1, the driving method for the shift register unit comprising:
in a display input period of a frame period, charging, by a display input circuit, the first pull-up node and the second pull-up node in response to the display control signal, with the first auxiliary input circuit and the second auxiliary input circuit being turned on in response to the display control signal; pulling down, by the first pull-down control circuit, the level of the first pull-down node under the control of both the level of the first pull-up node and the first auxiliary input circuit, so as to turn off a first pull-down circuit; and pulling down, by the second pull-down control circuit, the level of the second pull-down node under the control of both the level of the second pull-up node and the second auxiliary input circuit, so as to turn off a second pull-down circuit; and
in a blanking input period of the frame period, charging, by a blanking input circuit, the first pull-up node and the second pull-up node in response to the blanking control signal, with the first auxiliary input circuit and the second auxiliary input circuit being turned on in response to the blanking control signal; pulling down, by the first pull-down control circuit, the level of the first pull-down node under the control of both the level of the first pull-up node and the first auxiliary input circuit, so as to turn off the first pull-down circuit; and pulling down, by the second pull-down control circuit, the level of the second pull-down node under the control of both the level of the second pull-up node and the second auxiliary input circuit, so as to turn off the second pull-down circuit.

16. The driving method according to claim 15, wherein in a case where the first input/output unit further includes a third auxiliary input circuit, the second input/output unit further includes a fourth auxiliary input circuit, the driving method for the shift register unit further comprises:
in the display input period, directly pulling down, by the third auxiliary input circuit, the level of the first pull-down node in response to the display control signal, so as to turn off the first pull-down circuit; and directly pulling down, by the fourth auxiliary input circuit, the level of the second pull-down node in response to the display control signal, so as to turn off the second pull-down circuit; and
in the blanking input period, directly pulling down, by the third auxiliary input circuit, the level of the first pull-down node in response to the blanking control signal, so as to turn off the first pull-down circuit; and directly pulling down, by the fourth auxiliary input circuit, the level of the second pull-down node in response to the blanking control signal, so as to turn off the second pull-down circuit.

17. The shift register unit according to claim 4, wherein the first input/output unit further includes a third auxiliary input circuit, and the second input/output unit further includes a fourth auxiliary input circuit;
the third auxiliary input circuit is coupled to the first pull-down node, and the third auxiliary input circuit is configured to control the level of the first pull-down node in response to the display control signal and the blanking control signal; and
the fourth auxiliary input circuit is coupled to the second pull-down node, and the fourth auxiliary input circuit is configured to control the level of the second pull-down node in response to the display control signal and the blanking control signal;
the first auxiliary input circuit is coupled to the third auxiliary node, the third auxiliary input circuit includes a fifteenth transistor and a seventeenth transistor; a control electrode of the fifteenth transistor is coupled to the display control signal terminal, a first electrode of the fifteenth transistor is coupled to the first pull-down node, and a second electrode of the fifteenth transistor is coupled to the second voltage terminal; and a control electrode of the seventeenth transistor is coupled to the blanking pull-up control node, a first electrode of the seventeenth transistor is coupled to the third auxiliary node, and a second electrode of the seventeenth transistor is coupled to the second voltage terminal; and
the fourth auxiliary input circuit includes an eighteenth transistor and a twentieth transistor; a control electrode of the eighteenth transistor is coupled to the display control signal terminal, a first electrode of the eighteenth transistor is coupled to the second pull-down node, and a second electrode of the eighteenth transistor is coupled to the second voltage terminal; and a control electrode of the twentieth transistor is coupled to the blanking pull-up control node, a first electrode of the twentieth transistor is coupled to the third auxiliary node, and a second electrode of the twentieth transistor is coupled to the second voltage terminal.

18. The shift register unit according to claim 11, wherein the second output circuit includes a forty-sixth transistor, a forty-seventh transistor, a fourth capacitor and a fifth capacitor; a control electrode of the forty-sixth transistor is coupled to the second pull-up node, a first electrode of the forty-sixth transistor is coupled to a fifth clock signal terminal, and a second electrode of the forty-sixth transistor is coupled to a third pixel scanning signal output terminal; a control electrode of the forty-seventh transistor is coupled to the second pull-up node, a first electrode of the forty-seventh transistor is coupled to a sixth clock signal terminal, and a second electrode of the forty-seventh transistor is coupled to a fourth pixel scanning signal output terminal; a first electrode of the fourth capacitor is coupled to the control electrode of the forty-sixth transistor, and a second electrode of the fourth capacitor is coupled to the third pixel scanning signal output terminal; and a first electrode of the fifth capacitor is coupled to the control electrode of the forty-seventh transistor, and a second electrode of the fifth capacitor is coupled to the fourth pixel scanning signal output terminal;

the second pull-down circuit includes a fortieth transistor, a forty-first transistor, a forty-second transistor, a forty-third transistor, a forty-fourth transistor and a forty-fifth transistor; a control electrode of the fortieth transistor is coupled to the first pull-down node, a first electrode of the fortieth transistor is coupled to the second pull-up node, and a second electrode of the fortieth transistor is coupled to the second voltage terminal; a control electrode of the forty-first transistor is coupled to the second pull-down node, a first electrode of the forty-first transistor is coupled to the second pull-up node, and a second electrode of the forty-first transistor is coupled to the second voltage terminal; a control electrode of the forty-second transistor is coupled to the second pull-down node, a first electrode of the forty-second transistor is coupled to the third pixel scanning signal output terminal, and a second electrode of the forty-second transistor is coupled to the fourth voltage terminal; a control electrode of the forty-third transistor is coupled to the first pull-down node, a first electrode of the forty-third transistor is coupled to the third pixel scanning signal output terminal, and a second electrode of the forty-third transistor is coupled to the fourth voltage terminal; a control electrode of the forty-fourth transistor is coupled to the second pull-down node, a first electrode of the forty-fourth transistor is coupled to the fourth pixel scanning signal output terminal, and a second electrode of the forty-fourth transistor is coupled to the fourth voltage terminal; and a control electrode of the forty-fifth transistor is coupled to the first pull-down node, a first electrode of the forty-fifth transistor is coupled to the fourth pixel scanning signal output terminal, and a second electrode of the forty-fifth transistor is coupled to the fourth voltage terminal;

the second display reset circuit includes a forty-eighth transistor; and a control electrode of the forty-eighth transistor is coupled to the display reset signal terminal, a first electrode of the forty-eighth transistor is coupled to the second pull-up node, and a second electrode of the forty-eighth transistor is coupled to the second voltage terminal; and the second global reset circuit includes a forty-ninth transistor; and a control electrode of the forty-ninth transistor is coupled to the global reset signal terminal, a first electrode of the forty-ninth transistor is coupled to the second pull-up node, and a second electrode of the forty-ninth transistor is coupled to the second voltage terminal.

19. The shift register unit according to claim 11, wherein the blanking input circuit includes a twenty-second transistor, a twenty-third transistor and a twenty-fourth transistor; a control electrode of the twenty-second transistor is coupled to a blanking pull-up control node, a first electrode of the twenty-second transistor is coupled to a first clock signal terminal, and a second electrode of the twenty-second transistor is coupled to a blanking pull-up node; a control electrode of the twenty-third transistor is coupled to the first clock signal terminal, a first electrode of the twenty-third transistor is coupled to the blanking pull-up node, and a second electrode of the twenty-third transistor is coupled to the first pull-up node; and a control electrode of the twenty-fourth transistor is coupled to the first clock signal terminal, a first electrode of the twenty-fourth transistor is coupled to the blanking pull-up node, and a second electrode of the twenty-fourth transistor is coupled to the second pull-up node; and the display input circuit includes a twenty-fifth transistor and a twenty-sixth transistor; a control electrode of the twenty-fifth transistor is coupled to a display control signal terminal, a first electrode of the twenty-fifth transistor is coupled to the display control signal terminal, and a second electrode of the twenty-fifth transistor is coupled to the first pull-up node; and a control electrode of the twenty-sixth transistor is coupled to the display control signal terminal, a first electrode of the twenty-sixth transistor is coupled to the display control signal terminal, and a second electrode of the twenty-sixth transistor is coupled to the second pull-up node.

20. The shift register unit according to claim 11, wherein the compensation selection circuit includes a twenty-first transistor and a first capacitor; a control electrode of the twenty-first transistor is coupled to a compensation selection control signal terminal, a first electrode of the twenty-first transistor is coupled to the display control signal terminal, and a second electrode of the twenty-first transistor is coupled to the blanking pull-up control node; and a first electrode of the first capacitor is coupled to the blanking pull-up control node, and a second electrode of the first capacitor is coupled to the second voltage terminal.

* * * * *

UNITED STATES PATENT AND TRADEMARK OFFICE
CERTIFICATE OF CORRECTION

| | | |
|---|---|---|
| PATENT NO. | : 11,823,629 B2 | Page 1 of 1 |
| APPLICATION NO. | : 17/793075 | |
| DATED | : November 21, 2023 | |
| INVENTOR(S) | : Xuehuan Feng and Yongqian Li | |

It is certified that error appears in the above-identified patent and that said Letters Patent is hereby corrected as shown below:

In the Claims

In Column 42, Line 33, please change "a-the" to --the--.

In Column 42, Line 37, please change "a-the" to --the--.

In Column 42, Line 40, please change "a-the" to --the--.

In Column 42, Line 42, please change "a-the" to --the--.

Signed and Sealed this
Second Day of January, 2024

Katherine Kelly Vidal
*Director of the United States Patent and Trademark Office*